US012413263B2

(12) United States Patent
Rajagopalan et al.

(10) Patent No.: US 12,413,263 B2
(45) Date of Patent: *Sep. 9, 2025

(54) DIELECTRIC RESONATOR ANTENNA MODULES

(71) Applicant: Apple Inc., Cupertino, CA (US)

(72) Inventors: Harish Rajagopalan, San Jose, CA (US); Bilgehan Avser, Pacifica, CA (US); David Garrido Lopez, Alviso, CA (US); Forhad Hasnat, Milpitas, CA (US); Mattia Pascolini, San Francisco, CA (US); Mikal Askarian Amiri, San Jose, CA (US); Rodney A. Gomez Angulo, Santa Clara, CA (US); Thomas W. Yang, Los Altos, CA (US); Jiechen Wu, Santa Clara, CA (US); Eric N. Nyland, Santa Clara, CA (US); Simone Paulotto, Redwood City, CA (US); Jennifer M. Edwards, San Francisco, CA (US); Matthew D. Hill, Mountain View, CA (US); Ihtesham H. Chowdhury, Palo Alto, CA (US); David A. Hurrell, San Mateo, CA (US); Siwen Yong, San Francisco, CA (US); Jiangfeng Wu, San Jose, CA (US); Daniel C. Wagman, Scotts Valley, CA (US); Soroush Akbarzadeh, San Francisco, CA (US); Robert Scritzky, Sunnyvale, CA (US); Subramanian Ramalingam, San Jose, CA (US)

( * ) Notice: Subject to any disclaimer, the term of this patent is extended or adjusted under 35 U.S.C. 154(b) by 291 days.

This patent is subject to a terminal disclaimer.

(21) Appl. No.: 18/306,116

(22) Filed: Apr. 24, 2023

(65) Prior Publication Data

US 2023/0261695 A1 Aug. 17, 2023

Related U.S. Application Data

(63) Continuation of application No. 16/920,297, filed on Jul. 2, 2020, now Pat. No. 11,700,035.

(51) Int. Cl.
*H01Q 9/04* (2006.01)
*G01R 31/28* (2006.01)
(Continued)

(52) U.S. Cl.
CPC .......... *H04B 3/52* (2013.01); *G01R 31/2822* (2013.01); *H01Q 1/2283* (2013.01); *H01Q 13/24* (2013.01); *H04B 3/54* (2013.01)

(58) Field of Classification Search
CPC .......... H01Q 25/005; H01Q 3/24; H01Q 3/28; H01Q 3/38; H01Q 5/30; H01Q 5/35;
(Continued)

(56) References Cited

U.S. PATENT DOCUMENTS 5,453,754 A 9/1995 Fray
5,952,972 A 9/1999 Ittipiboon et al.
(Continued)

FOREIGN PATENT DOCUMENTS

CN 106602232 A 4/2017
CN 110350307 A 10/2019
(Continued)

*Primary Examiner* — Linh V Nguyen

(74) *Attorney, Agent, or Firm* — Treyz Law Group, P.C.; Michael H. Lyons; Jinie M. Guihan

(57) ABSTRACT

An electronic device may be provided with an antenna module having a substrate. A phased antenna array of dielectric resonator antennas and a radio-frequency integrated circuit for the array may be mounted to one or more surfaces of the substrate. The dielectric resonator antennas may include dielectric columns excited by feed probes. The feed probes may be printed onto sidewalls of the dielectric columns or may be pressed against the sidewalls by biasing (Continued)

structures. A plastic substrate may be molded over each dielectric column and each of the feed probes in the array. The feed probes may cover multiple polarizations. The array may include elements for covering multiple frequency bands. The dielectric columns may be aligned a longitudinal axis and may be rotated at a non-zero and non-perpendicular angle with respect to the longitudinal axis.

20 Claims, 22 Drawing Sheets

(51) Int. Cl.
*H01Q 1/22* (2006.01)
*H01Q 13/24* (2006.01)
*H04B 3/52* (2006.01)
*H04B 3/54* (2006.01)

(58) Field of Classification Search
CPC .......... H01Q 5/378; H01Q 9/40; H01Q 1/007; H01Q 1/12; H01Q 1/22; H01Q 1/225; H01Q 1/2291; H01Q 1/36; H01Q 1/421; H01Q 1/46; H01Q 1/50; H01Q 13/08; H01Q 13/085; H01Q 13/24; H01Q 15/0013; H01Q 15/0073; H01Q 15/14; H01Q 19/021; H01Q 19/028; H01Q 19/104; H01Q 19/108; H01Q 19/17; H01Q 19/18; H01Q 19/30; H01Q 21/0093; H01Q 21/06; H01Q 21/26; H01Q 21/29; H01Q 21/30; H01Q 23/00; H01Q 25/001; H01Q 25/007; H01Q 3/2611; H01Q 3/2617; H01Q 3/2635; H01Q 3/2647; H01Q 3/30; H01Q 3/36; H01Q 3/42; H01Q 3/46; H01Q 5/28; H01Q 5/307; H01Q 5/335; H01Q 5/364; H01Q 5/371; H01Q 5/392; H01Q 5/40; H01Q 9/0435; H01Q 9/0492; H01Q 9/065; H01Q 9/16
USPC .......................................... 343/702, 700 MS
See application file for complete search history.

(56) References Cited

U.S. PATENT DOCUMENTS

| | | | |
|---|---|---|---|
| 6,294,967 B1 * | 9/2001 | Hirai | H01P 1/20345 333/204 |
| 6,653,985 B2 | 11/2003 | Sikina et al. | |
| 6,768,454 B2 | 7/2004 | Kingsley et al. | |
| 6,995,715 B2 | 2/2006 | Ying et al. | |
| 7,161,535 B2 * | 1/2007 | Palmer | H01Q 9/0485 343/700 MS |
| 7,391,372 B2 | 6/2008 | Lynch et al. | |
| 7,710,325 B2 | 5/2010 | Cheng | |
| 7,995,001 B2 | 8/2011 | Ohmi et al. | |
| 8,587,492 B2 | 11/2013 | Runyon | |
| 8,866,692 B2 | 10/2014 | Vazquez et al. | |
| 9,692,125 B1 | 6/2017 | Channabasappa et al. | |
| 9,698,455 B2 | 7/2017 | Hendry et al. | |
| 10,263,332 B2 | 4/2019 | Yong et al. | |
| 10,484,078 B2 | 11/2019 | Gharavi et al. | |
| 10,741,933 B2 | 8/2020 | Yong et al. | |
| 11,700,035 B2 * | 7/2023 | Rajagopalan | G01R 31/2822 343/771 |
| 2003/0020657 A1 * | 1/2003 | Sakamoto | H01Q 1/3291 343/700 MS |
| 2003/0034124 A1 * | 2/2003 | Sugaya | H01P 11/007 156/291 |
| 2003/0076259 A1 | 4/2003 | Zhang | |
| 2005/0236103 A1 * | 10/2005 | Sugaya | H01P 11/007 156/305 |
| 2006/0119518 A1 * | 6/2006 | Ohmi | H01Q 9/0485 343/873 |
| 2010/0103052 A1 | 4/2010 | Ying | |
| 2012/0235881 A1 | 9/2012 | Pan et al. | |
| 2014/0266957 A1 * | 9/2014 | Inoue | H01Q 21/08 343/843 |
| 2016/0156090 A1 * | 6/2016 | Campione | H01Q 15/006 333/219.1 |
| 2016/0322708 A1 * | 11/2016 | Tayfeh Aligodarz | H01Q 21/0087 |
| 2017/0040700 A1 * | 2/2017 | Leung | H01Q 9/0485 |
| 2017/0117638 A1 * | 4/2017 | Kim | H01Q 21/08 |
| 2017/0271772 A1 * | 9/2017 | Miraftab | H01Q 9/0485 |
| 2018/0026341 A1 | 1/2018 | Mow et al. | |
| 2018/0074173 A1 | 3/2018 | Trotta et al. | |
| 2018/0090816 A1 | 3/2018 | Mow et al. | |
| 2018/0090847 A1 | 3/2018 | Romano et al. | |
| 2018/0342801 A1 * | 11/2018 | Sharawi | H01Q 21/28 |
| 2019/0013580 A1 | 1/2019 | Vigano et al. | |
| 2019/0027802 A1 | 1/2019 | Noori et al. | |
| 2019/0027808 A1 * | 1/2019 | Mow | H04R 5/04 |
| 2019/0267709 A1 | 8/2019 | Mow et al. | |
| 2019/0319364 A1 | 10/2019 | Yang et al. | |
| 2019/0356397 A1 | 11/2019 | DaSilva et al. | |
| 2019/0372199 A1 | 12/2019 | Haridas et al. | |
| 2020/0212581 A1 | 7/2020 | Zhu et al. | |
| 2020/0212588 A1 | 7/2020 | Rofougaran et al. | |
| 2020/0280131 A1 | 9/2020 | Avser et al. | |
| 2020/0280133 A1 | 9/2020 | Avser et al. | |
| 2020/0365996 A1 | 11/2020 | Roth et al. | |

FOREIGN PATENT DOCUMENTS

| | | |
|---|---|---|
| JP | 2000278039 A | 10/2000 |
| JP | 2002524954 A | 8/2002 |
| JP | 3212835 U | 10/2017 |
| JP | 2018515035 A | 6/2018 |
| JP | 2019186942 A | 10/2019 |
| KR | 20160004720 A | 1/2016 |
| KR | 20200014601 A | 2/2020 |
| WO | 2015089643 A1 | 6/2015 |

* cited by examiner

DIELECTRIC RESONATOR ANTENNA MODULES

This application is a continuation of U.S. patent application Ser. No. 16/920,297, filed Jul. 2, 2020, which is hereby incorporated by reference herein in its entirety.

BACKGROUND

This relates generally to electronic devices and, more particularly, to electronic devices with wireless circuitry.

Electronic devices often include wireless circuitry. For example, cellular telephones, computers, and other devices often contain antennas and wireless transceivers for supporting wireless communications.

It may be desirable to support wireless communications in millimeter wave and centimeter wave communications bands. Millimeter wave communications, which are sometimes referred to as extremely high frequency (EHF) communications, and centimeter wave communications involve communications at frequencies of about 10-300 GHz. Operation at these frequencies may support high bandwidths but may raise significant challenges. For example, radio-frequency communications in millimeter and centimeter wave communications bands can be characterized by substantial attenuation and/or distortion during signal propagation through various mediums. The presence of conductive electronic device components can also make it difficult to incorporate circuitry for handling millimeter and centimeter wave communications into the electronic device. In addition, if care is not taken, manufacturing variations can undesirably limit the mechanical reliability and wireless performance of the antennas in the electronic device.

It would therefore be desirable to be able to provide electronic devices with improved components for supporting millimeter and centimeter wave communications.

SUMMARY

An electronic device may be provided with a housing, a display, and wireless circuitry. The housing may include peripheral conductive housing structures that run around a periphery of the device. The display may include a display cover layer mounted to the peripheral conductive housing structures. The wireless circuitry may include a phased antenna array that conveys radio-frequency signals in one or more frequency bands between 10 GHz and 300 GHz. The phased antenna array may convey the radio-frequency signals through the display cover layer or other dielectric cover layers in the device.

The phased antenna array may include probe-fed dielectric resonator antennas. The phased antenna array and a radio-frequency integrated circuit (RFIC) for the phased antenna array may both be integrated into an antenna module. The antenna module may include an antenna module substrate. The RFIC may be surface-mounted to a first surface of the substrate whereas the probe-fed dielectric resonator antennas are mounted to a second surface of the substrate. Alternatively, the RFIC and probe-fed dielectric resonator antennas may be mounted to the same surface of the substrate. An over-mold structure may be provided over the RFIC. Additional phased antenna arrays may be mounted to the substrate if desired.

Each of the probe-fed dielectric resonator antennas may include a dielectric resonating element mounted to a surface of the substrate. One or two feed probes may be coupled to sidewalls of the dielectric resonating element at the surface of the substrate to feed the dielectric resonating element. In one suitable arrangement, the feed probes may be formed from conductive traces that are patterned onto the sidewalls. In this arrangement, each dielectric resonating element may be formed on the antenna module at the same time, thereby minimizing mechanical variations to optimize mechanical and wireless performance of the module. The antenna module may be cut from a substrate used to form multiple antenna modules for multiple devices to minimize manufacturing cost and complexity if desired.

In another suitable arrangement, the feed probes may be formed from stamped sheet metal and may be pressed against the sidewalls by feed probe biasing structures that are molded over the feed probes and at least some of the dielectric resonating element. The feed probe biasing structures may also press parasitic elements against the sidewalls if desired. A plastic substrate may be molded over the feed probes and at least some of the dielectric resonating element for each of the antennas in the array to form an antenna package. The antenna package may be surface-mounted to the substrate (e.g., a flexible printed circuit) to form the antenna module. The antenna module may be aligned with a notch in a display module for the device. The dielectric resonating elements may be aligned along a longitudinal axis. If desired, each of the sidewalls of the dielectric resonating elements may be rotated at non-zero and non-perpendicular angles with respect to the longitudinal axis to maximize isolation between the antennas.

DETAILED DESCRIPTION

Figure 1:
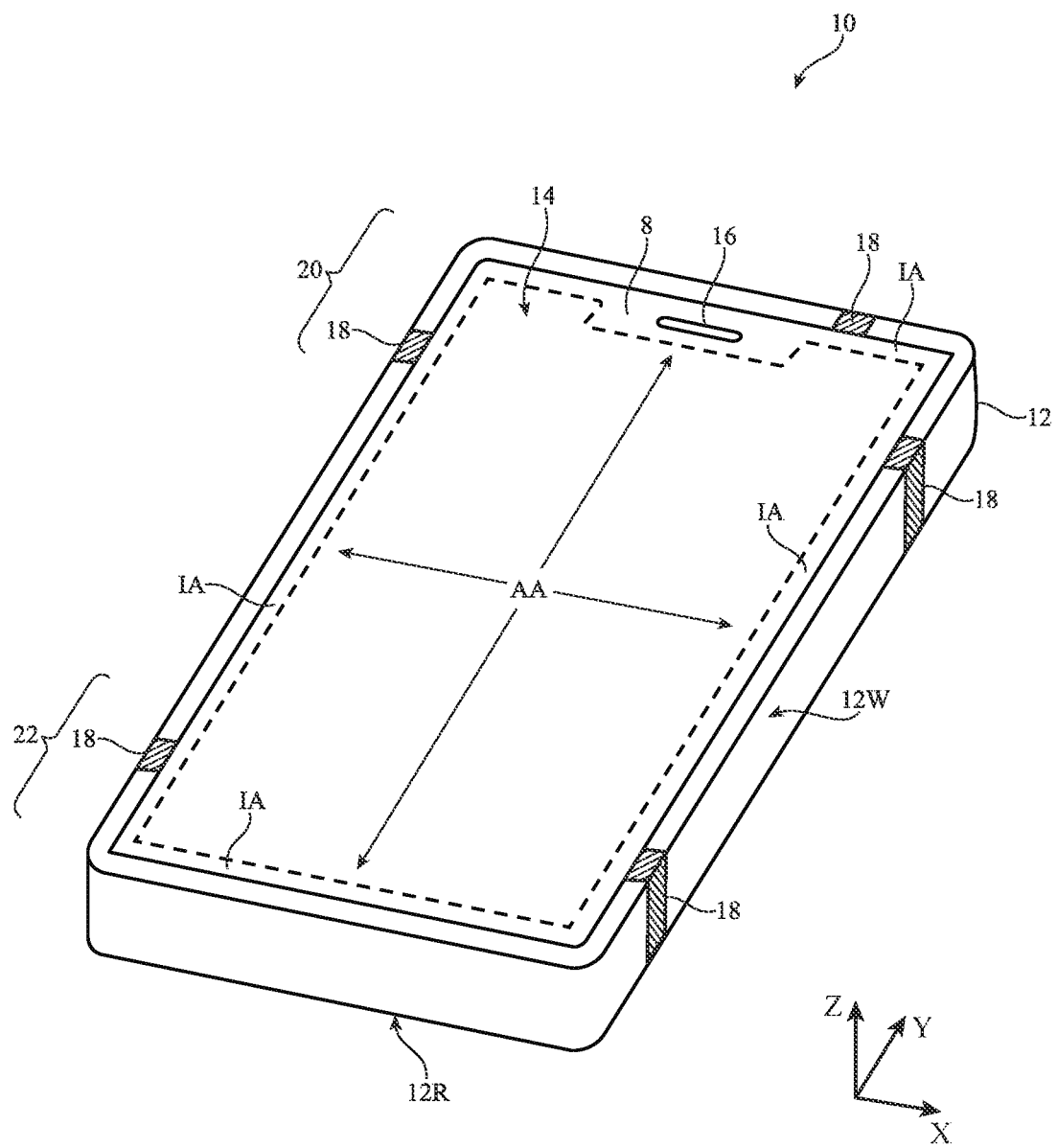
FIG. 1 is a perspective view of an illustrative electronic device in accordance with some embodiments.

An electronic device such as electronic device 10 of FIG. 1 may contain wireless circuitry. The wireless circuitry may include one or more antennas. The antennas may include phased antenna arrays that are used for performing wireless communications using millimeter and centimeter wave signals. Millimeter wave signals, which are sometimes referred to as extremely high frequency (EHF) signals, propagate at frequencies above about 30 GHz (e.g., at 60 GHz or other frequencies between about 30 GHz and 300 GHz). Centimeter wave signals propagate at frequencies between about 10 GHz and 30 GHz. If desired, device 10 may also contain antennas for handling satellite navigation system signals, cellular telephone signals, local wireless area network signals, near-field communications, light-based wireless communications, or other wireless communications.

Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a handheld device such as a cellular telephone, a media player, or other small portable device. Device 10 may also be a set-top box, a desktop computer, a display into which a computer or other processing circuitry has been integrated, a display without an integrated computer, a wireless access point, a wireless base station, an electronic device incorporated into a kiosk, building, or vehicle, or other suitable electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may, if desired, have a display such as display 14. Display 14 may be mounted on the front face of device 10 (e.g., display 14 may form some or all of the front face of the device). Display 14 may be a touch screen that incorporates capacitive touch electrodes or may be insensitive to touch. The rear face of housing 12 (i.e., the face of device 10 opposing the front face of device 10) may have a substantially planar housing wall such as rear housing wall 12R (e.g., a planar housing wall). Rear housing wall 12R may have slots that pass entirely through the rear housing wall and that therefore separate portions of housing 12 from each other. Rear housing wall 12R may include conductive portions and/or dielectric portions. If desired, rear housing wall 12R may include a planar metal layer covered by a thin layer or coating of dielectric such as glass, plastic, sapphire, or ceramic. Housing 12 may also have shallow grooves that do not pass entirely through housing 12. The slots and grooves may be filled with plastic or other dielectrics. If desired, portions of housing 12 that have been separated from each other (e.g., by a through slot) may be joined by internal conductive structures (e.g., sheet metal or other metal members that bridge the slot).

Housing 12 may include peripheral housing structures such as peripheral structures 12W. Conductive portions of peripheral structures 12W and conductive portions of rear housing wall 12R may sometimes be referred to herein collectively as conductive structures of housing 12. Peripheral structures 12W may run around the periphery of device 10 and display 14. In configurations in which device 10 and display 14 have a rectangular shape with four edges, peripheral structures 12W may be implemented using peripheral housing structures that have a rectangular ring shape with four corresponding edges and that extend from rear housing wall 12R to the front face of device 10 (as an example). Peripheral structures 12W or part of peripheral structures 12W may serve as a bezel for display 14 (e.g., a cosmetic trim that surrounds all four sides of display 14 and/or that helps hold display 14 to device 10) if desired. Peripheral structures 12W may, if desired, form sidewall structures for device 10 (e.g., by forming a metal band with vertical sidewalls, curved sidewalls, etc.).

Peripheral structures 12W may be formed of a conductive material such as metal and may therefore sometimes be referred to as peripheral conductive housing structures, conductive housing structures, peripheral metal structures, peripheral conductive sidewalls, peripheral conductive sidewall structures, conductive housing sidewalls, peripheral conductive housing sidewalls, sidewalls, sidewall structures, or a peripheral conductive housing member (as examples). Peripheral conductive housing structures 12W may be formed from a metal such as stainless steel, aluminum, or other suitable materials. One, two, or more than two separate structures may be used in forming peripheral conductive housing structures 12W.

It is not necessary for peripheral conductive housing structures 12W to have a uniform cross-section. For example, the top portion of peripheral conductive housing structures 12W may, if desired, have an inwardly protruding ledge that helps hold display 14 in place. The bottom portion of peripheral conductive housing structures 12W may also have an enlarged lip (e.g., in the plane of the rear surface of device 10). Peripheral conductive housing structures 12W may have substantially straight vertical sidewalls, may have sidewalls that are curved, or may have other suitable shapes. In some configurations (e.g., when peripheral conductive housing structures 12W serve as a bezel for display 14), peripheral conductive housing structures 12W may run around the lip of housing 12 (i.e., peripheral conductive housing structures 12W may cover only the edge of housing 12 that surrounds display 14 and not the rest of the sidewalls of housing 12).

Rear housing wall 12R may lie in a plane that is parallel to display 14. In configurations for device 10 in which some or all of rear housing wall 12R is formed from metal, it may be desirable to form parts of peripheral conductive housing structures 12W as integral portions of the housing structures forming rear housing wall 12R. For example, rear housing wall 12R of device 10 may include a planar metal structure and portions of peripheral conductive housing structures 12W on the sides of housing 12 may be formed as flat or curved vertically extending integral metal portions of the planar metal structure (e.g., housing structures 12R and 12W may be formed from a continuous piece of metal in a unibody configuration). Housing structures such as these may, if desired, be machined from a block of metal and/or may include multiple metal pieces that are assembled together to form housing 12. Rear housing wall 12R may have one or more, two or more, or three or more portions. Peripheral conductive housing structures 12W and/or conductive portions of rear housing wall 12R may form one or more exterior surfaces of device 10 (e.g., surfaces that are visible to a user of device 10) and/or may be implemented using internal structures that do not form exterior surfaces of device 10 (e.g., conductive housing structures that are not visible to a user of device 10 such as conductive structures that are covered with layers such as thin cosmetic layers, protective coatings, and/or other coating layers that may include dielectric materials such as glass, ceramic, plastic, or other structures that form the exterior surfaces of device 10 and/or serve to hide peripheral conductive housing structures 12W and/or conductive portions of rear housing wall 12R from view of the user).

Display 14 may have an array of pixels that form an active area AA that displays images for a user of device 10. For example, active area AA may include an array of display pixels. The array of pixels may be formed from liquid crystal display (LCD) components, an array of electrophoretic pixels, an array of plasma display pixels, an array of organic light-emitting diode display pixels or other light-emitting diode pixels, an array of electrowetting display pixels, or display pixels based on other display technologies. If desired, active area AA may include touch sensors such as touch sensor capacitive electrodes, force sensors, or other sensors for gathering a user input.

Display 14 may have an inactive border region that runs along one or more of the edges of active area AA. Inactive area IA of display 14 may be free of pixels for displaying images and may overlap circuitry and other internal device structures in housing 12. To block these structures from view by a user of device 10, the underside of the display cover layer or other layers in display 14 that overlap inactive area IA may be coated with an opaque masking layer in inactive area IA. The opaque masking layer may have any suitable color. Inactive area IA may include a recessed region such as notch 8 that extends into active area AA. Active area AA may, for example, be defined by the lateral area of a display module for display 14 (e.g., a display module that includes pixel circuitry, touch sensor circuitry, etc.). The display module may have a recess or notch in upper region 20 of device 10 that is free from active display circuitry (i.e., that forms notch 8 of inactive area IA). Notch 8 may be a substantially rectangular region that is surrounded (defined) on three sides by active area AA and on a fourth side by peripheral conductive housing structures 12W.

Display 14 may be protected using a display cover layer such as a layer of transparent glass, clear plastic, transparent ceramic, sapphire, or other transparent crystalline material, or other transparent layer(s). The display cover layer may have a planar shape, a convex curved profile, a shape with planar and curved portions, a layout that includes a planar main area surrounded on one or more edges with a portion that is bent out of the plane of the planar main area, or other suitable shapes. The display cover layer may cover the entire front face of device 10. In another suitable arrangement, the display cover layer may cover substantially all of the front face of device 10 or only a portion of the front face of device 10. Openings may be formed in the display cover layer. For example, an opening may be formed in the display cover layer to accommodate a button. An opening may also be formed in the display cover layer to accommodate ports such as speaker port 16 in notch 8 or a microphone port. Openings may be formed in housing 12 to form communications ports (e.g., an audio jack port, a digital data port, etc.) and/or audio ports for audio components such as a speaker and/or a microphone if desired.

Display 14 may include conductive structures such as an array of capacitive electrodes for a touch sensor, conductive lines for addressing pixels, driver circuits, etc. Housing 12 may include internal conductive structures such as metal frame members and a planar conductive housing member (sometimes referred to as a backplate) that spans the walls of housing 12 (i.e., a substantially rectangular sheet formed from one or more metal parts that is welded or otherwise connected between opposing sides of peripheral conductive housing structures 12W). The backplate may form an exterior rear surface of device 10 or may be covered by layers such as thin cosmetic layers, protective coatings, and/or other coatings that may include dielectric materials such as glass, ceramic, plastic, or other structures that form the exterior surfaces of device 10 and/or serve to hide the backplate from view of the user. Device 10 may also include conductive structures such as printed circuit boards, components mounted on printed circuit boards, and other internal conductive structures. These conductive structures, which may be used in forming a ground plane in device 10, may extend under active area AA of display 14, for example.

In regions 22 and 20, openings may be formed within the conductive structures of device 10 (e.g., between peripheral conductive housing structures 12W and opposing conductive ground structures such as conductive portions of rear housing wall 12R, conductive traces on a printed circuit board, conductive electrical components in display 14, etc.). These openings, which may sometimes be referred to as gaps, may be filled with air, plastic, and/or other dielectrics and may be used in forming slot antenna resonating elements for one or more antennas in device 10, if desired.

Conductive housing structures and other conductive structures in device 10 may serve as a ground plane for the antennas in device 10. The openings in regions 22 and 20 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, may contribute to the performance of a parasitic antenna resonating element, or may otherwise serve as part of antenna structures formed in regions 22 and 20. If desired, the ground plane that is under active area AA of display 14 and/or other metal structures in device 10 may have portions that extend into parts of the ends of device 10 (e.g., the ground may extend towards the dielectric-filled openings in regions 22 and 20), thereby narrowing the slots in regions 22 and 20.

In general, device 10 may include any suitable number of antennas (e.g., one or more, two or more, three or more, four or more, etc.). The antennas in device 10 may be located at opposing first and second ends of an elongated device housing (e.g., ends at regions 22 and 20 of device 10 of FIG. 1), along one or more edges of a device housing, in the center of a device housing, in other suitable locations, or in one or more of these locations. The arrangement of FIG. 1 is merely illustrative.

Portions of peripheral conductive housing structures 12W may be provided with peripheral gap structures. For example, peripheral conductive housing structures 12W may be provided with one or more gaps such as gaps 18, as shown in FIG. 1. The gaps in peripheral conductive housing structures 12W may be filled with dielectric such as polymer, ceramic, glass, air, other dielectric materials, or combinations of these materials. Gaps 18 may divide peripheral conductive housing structures 12W into one or more peripheral conductive segments. The conductive segments that are formed in this way may form parts of antennas in device 10 if desired. Gaps 18 may be omitted if desired. Other dielectric openings may be formed in peripheral conductive housing structures 12W (e.g., dielectric openings other than gaps 18) and may serve as dielectric antenna windows for antennas mounted within the interior of device 10. Antennas within device 10 may be aligned with the dielectric antenna windows for conveying radio-frequency signals through peripheral conductive housing structures 12W. Antennas within device 10 may also be aligned with inactive area IA of display 14 for conveying radio-frequency signals through display 14.

In order to provide an end user of device 10 with as large of a display as possible (e.g., to maximize an area of the device used for displaying media, running applications, etc.), it may be desirable to increase the amount of area at the front face of device 10 that is covered by active area AA of display 14. Increasing the size of active area AA may reduce the size of inactive area IA within device 10. This may reduce the area behind display 14 that is available for antennas within device 10. For example, active area AA of display 14 may include conductive structures that serve to block radio-frequency signals handled by antennas mounted behind active area AA from radiating through the front face of device 10. It would therefore be desirable to be able to provide antennas that occupy a small amount of space within device 10 (e.g., to allow for as large of a display active area AA as possible) while still allowing the antennas to communicate with wireless equipment external to device 10 with satisfactory efficiency bandwidth.

In a typical scenario, device 10 may have one or more upper antennas and one or more lower antennas (as an example). An upper antenna may, for example, be formed at the upper end of device 10 in region 20. A lower antenna may, for example, be formed at the lower end of device 10 in region 22. Additional antennas may be formed along the edges of housing 12 extending between regions 20 and 22 if desired. The antennas may be used separately to cover identical communications bands, overlapping communications bands, or separate communications bands. The antennas may be used to implement an antenna diversity scheme or a multiple-input-multiple-output (MIMO) antenna scheme. Other antennas for covering any other desired frequencies may also be mounted at any desired locations within the interior of device 10. The example of FIG. 1 is merely illustrative. If desired, housing 12 may have other shapes (e.g., a square shape, cylindrical shape, spherical shape, combinations of these and/or different shapes, etc.).

Figure 2:
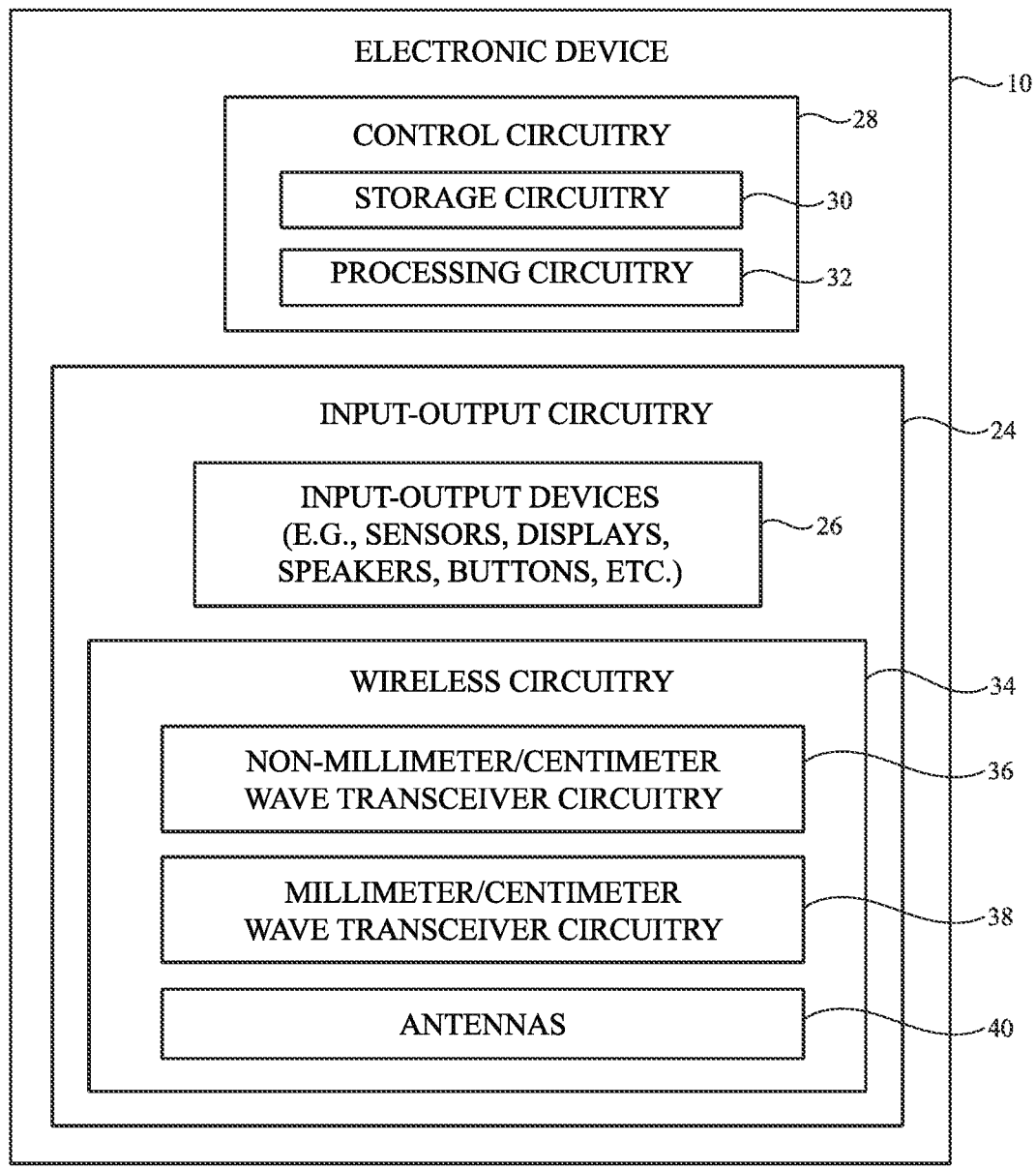
FIG. 2 is a schematic diagram of illustrative circuitry in an electronic device in accordance with some embodiments.

A schematic diagram of illustrative components that may be used in device 10 is shown in FIG. 2. As shown in FIG. 2, device 10 may include control circuitry 28. Control circuitry 28 may include storage such as storage circuitry 30. Storage circuitry 30 may include hard disk drive storage, nonvolatile memory (e.g., flash memory or other electrically-programmable-read-only memory configured to form a solid-state drive), volatile memory (e.g., static or dynamic random-access-memory), etc. Control circuitry 28 may include processing circuitry such as processing circuitry 32. Processing circuitry 32 may be used to control the operation of device 10. Processing circuitry 32 may include on one or more microprocessors, microcontrollers, digital signal processors, host processors, baseband processor integrated circuits, application specific integrated circuits, central processing units (CPUs), etc. Control circuitry 28 may be configured to perform operations in device 10 using hardware (e.g., dedicated hardware or circuitry), firmware, and/or software. Software code for performing operations in device 10 may be stored on storage circuitry 30 (e.g., storage circuitry 30 may include non-transitory (tangible) computer readable storage media that stores the software code). The software code may sometimes be referred to as program instructions, software, data, instructions, or code. Software code stored on storage circuitry 30 may be executed by processing circuitry 32.

Control circuitry 28 may be used to run software on device 10 such as internet browsing applications, voice-over-internet-protocol (VOIP) telephone call applications, email applications, media playback applications, operating system functions, etc. To support interactions with external equipment, control circuitry 28 may be used in implementing communications protocols. Communications protocols that may be implemented using control circuitry 28 include internet protocols, wireless local area network protocols (e.g., IEEE 802.11 protocols—sometimes referred to as WiFi®), protocols for other short-range wireless communications links such as the Bluetooth® protocol or other WPAN protocols, IEEE 802.11ad protocols, cellular telephone protocols, MIMO protocols, antenna diversity protocols, satellite navigation system protocols, antenna-based spatial ranging protocols (e.g., radio detection and ranging (RADAR) protocols or other desired range detection protocols for signals conveyed at millimeter and centimeter wave frequencies), etc. Each communication protocol may be associated with a corresponding radio access technology (RAT) that specifies the physical connection methodology used in implementing the protocol.

Device 10 may include input-output circuitry 24. Input-output circuitry 24 may include input-output devices 26. Input-output devices 26 may be used to allow data to be supplied to device 10 and to allow data to be provided from device 10 to external devices. Input-output devices 26 may include user interface devices, data port devices, sensors, and other input-output components. For example, input-output devices may include touch screens, displays without touch sensor capabilities, buttons, joysticks, scrolling wheels, touch pads, key pads, keyboards, microphones, cameras, speakers, status indicators, light sources, audio jacks and other audio port components, digital data port devices, light sensors, gyroscopes, accelerometers or other components that can detect motion and device orientation relative to the Earth, capacitance sensors, proximity sensors (e.g., a capacitive proximity sensor and/or an infrared proximity sensor), magnetic sensors, and other sensors and input-output components.

Input-output circuitry 24 may include wireless circuitry such as wireless circuitry 34 for wirelessly conveying radio-frequency signals. While control circuitry 28 is shown separately from wireless circuitry 34 in the example of FIG. 2 for the sake of clarity, wireless circuitry 34 may include processing circuitry that forms a part of processing circuitry 32 and/or storage circuitry that forms a part of storage circuitry 30 of control circuitry 28 (e.g., portions of control circuitry 28 may be implemented on wireless circuitry 34). As an example, control circuitry 28 may include baseband processor circuitry or other control components that form a part of wireless circuitry 34.

Wireless circuitry 34 may include millimeter and centimeter wave transceiver circuitry such as millimeter/centimeter wave transceiver circuitry 38. Millimeter/centimeter wave transceiver circuitry 38 may support communications at frequencies between about 10 GHz and 300 GHz. For example, millimeter/centimeter wave transceiver circuitry 38 may support communications in Extremely High Frequency (EHF) or millimeter wave communications bands between about 30 GHz and 300 GHz and/or in centimeter wave communications bands between about 10 GHz and 30 GHz (sometimes referred to as Super High Frequency (SHF) bands). As examples, millimeter/centimeter wave transceiver circuitry 38 may support communications in an IEEE K communications band between about 18 GHz and 27 GHz, a $K_a$ communications band between about 26.5 GHz and 40 GHz, a $K_u$ communications band between about 12 GHz and 18 GHz, a V communications band between about 40 GHz and 75 GHz, a W communications band between about 75 GHz and 110 GHz, or any other desired frequency band between approximately 10 GHz and 300 GHz. If desired, millimeter/centimeter wave transceiver circuitry 38 may support IEEE 802.11ad communications at 60 GHz and/or 5th generation mobile networks or $5^{th}$ generation wireless systems (5G) communications bands between 27 GHz and 90 GHz. Millimeter/centimeter wave transceiver circuitry 38 may be formed from one or more integrated circuits (e.g., multiple integrated circuits mounted on a common printed circuit in a system-in-package device, one or more integrated circuits mounted on different substrates, etc.).

If desired, millimeter/centimeter wave transceiver circuitry 38 (sometimes referred to herein simply as transceiver circuitry 38 or millimeter/centimeter wave circuitry 38) may perform spatial ranging operations using radio-frequency signals at millimeter and/or centimeter wave signals that are transmitted and received by millimeter/centimeter wave transceiver circuitry 38. The received signals may be a version of the transmitted signals that have been reflected off of external objects and back towards device 10. Control circuitry 28 may process the transmitted and received signals to detect or estimate a range between device 10 and one or more external objects in the surroundings of device 10 (e.g., objects external to device 10 such as the body of a user or other persons, other devices, animals, furniture, walls, or other objects or obstacles in the vicinity of device 10). If desired, control circuitry 28 may also process the transmitted and received signals to identify a two or three-dimensional spatial location of the external objects relative to device 10.

Spatial ranging operations performed by millimeter/centimeter wave transceiver circuitry 38 are unidirectional. Millimeter/centimeter wave transceiver circuitry 38 may additionally or alternatively perform bidirectional communications with external wireless equipment. Bidirectional communications involve both the transmission of wireless data by millimeter/centimeter wave transceiver circuitry 38 and the reception of wireless data that has been transmitted by external wireless equipment. The wireless data may, for example, include data that has been encoded into corresponding data packets such as wireless data associated with a telephone call, streaming media content, internet browsing, wireless data associated with software applications running on device 10, email messages, etc.

If desired, wireless circuitry 34 may include transceiver circuitry for handling communications at frequencies below 10 GHz such as non-millimeter/centimeter wave transceiver circuitry 36. Non-millimeter/centimeter wave transceiver circuitry 36 may include wireless local area network (WLAN) transceiver circuitry that handles 2.4 GHz and 5 GHz bands for Wi-Fi® (IEEE 802.11) communications, wireless personal area network (WPAN) transceiver circuitry that handles the 2.4 GHz Bluetooth® communications band, cellular telephone transceiver circuitry that handles cellular telephone communications bands from 700 to 960 MHz, 1710 to 2170 MHz, 2300 to 2700 MHz, and/or or any other desired cellular telephone communications bands between 600 MHz and 4000 MHz, GPS receiver circuitry that receives GPS signals at 1575 MHz or signals for handling other satellite positioning data (e.g., GLONASS signals at 1609 MHz), television receiver circuitry, AM/FM radio receiver circuitry, paging system transceiver circuitry, ultra-wideband (UWB) transceiver circuitry, near field communications (NFC) circuitry, etc. Non-millimeter/centimeter wave transceiver circuitry 36 and millimeter/centimeter wave transceiver circuitry 38 may each include one or more integrated circuits, power amplifier circuitry, low-noise input amplifiers, passive radio-frequency components, switching circuitry, transmission line structures, and other circuitry for handling radio-frequency signals. Non-millimeter/centimeter wave transceiver circuitry 36 may be omitted if desired.

Wireless circuitry 34 may include antennas 40. Non-millimeter/centimeter wave transceiver circuitry 36 may convey radio-frequency signals below 10 GHz using one or more antennas 40. Millimeter/centimeter wave transceiver circuitry 38 may convey radio-frequency signals above 10 GHz (e.g., at millimeter wave and/or centimeter wave frequencies) using antennas 40. In general, transceiver circuitry 36 and 38 may be configured to cover (handle) any suitable communications (frequency) bands of interest. The transceiver circuitry may convey radio-frequency signals using antennas 40 (e.g., antennas 40 may convey the radio-frequency signals for the transceiver circuitry). The term "convey radio-frequency signals" as used herein means the transmission and/or reception of the radio-frequency signals (e.g., for performing unidirectional and/or bidirectional wireless communications with external wireless communications equipment). Antennas 40 may transmit the radio-frequency signals by radiating the radio-frequency signals into free space (or to freespace through intervening device structures such as a dielectric cover layer). Antennas 40 may additionally or alternatively receive the radio-frequency signals from free space (e.g., through intervening devices structures such as a dielectric cover layer). The transmission and reception of radio-frequency signals by antennas 40 each involve the excitation or resonance of antenna currents on an antenna resonating element in the antenna by the radio-frequency signals within the frequency band(s) of operation of the antenna.

In satellite navigation system links, cellular telephone links, and other long-range links, radio-frequency signals are typically used to convey data over thousands of feet or miles. In Wi-Fi® and Bluetooth® links at 2.4 and 5 GHz and other short-range wireless links, radio-frequency signals are typically used to convey data over tens or hundreds of feet. Millimeter/centimeter wave transceiver circuitry 38 may convey radio-frequency signals over short distances that travel over a line-of-sight path. To enhance signal reception for millimeter and centimeter wave communications, phased antenna arrays and beam steering techniques may be used (e.g., schemes in which antenna signal phase and/or magnitude for each antenna in an array are adjusted to perform beam steering). Antenna diversity schemes may also be used to ensure that the antennas that have become blocked or that are otherwise degraded due to the operating environment of device 10 can be switched out of use and higher-performing antennas used in their place.

Antennas 40 in wireless circuitry 34 may be formed using any suitable antenna types. For example, antennas 40 may include antennas with resonating elements that are formed from stacked patch antenna structures, loop antenna structures, patch antenna structures, inverted-F antenna structures, slot antenna structures, planar inverted-F antenna structures, monopole antenna structures, dipole antenna structures, helical antenna structures, Yagi (Yagi-Uda) antenna structures, hybrids of these designs, etc. In another suitable arrangement, antennas 40 may include antennas with dielectric resonating elements such as dielectric resonator antennas. If desired, one or more of antennas 40 may be cavity-backed antennas. Different types of antennas may be used for different bands and combinations of bands. For example, one type of antenna may be used in forming a non-millimeter/centimeter wave wireless link for non-millimeter/centimeter wave transceiver circuitry 36 and another type of antenna may be used in conveying radio-frequency signals at millimeter and/or centimeter wave frequencies for millimeter/centimeter wave transceiver circuitry 38. Antennas 40 that are used to convey radio-frequency signals at millimeter and centimeter wave frequencies may be arranged in one or more phased antenna arrays.

Figure 3:
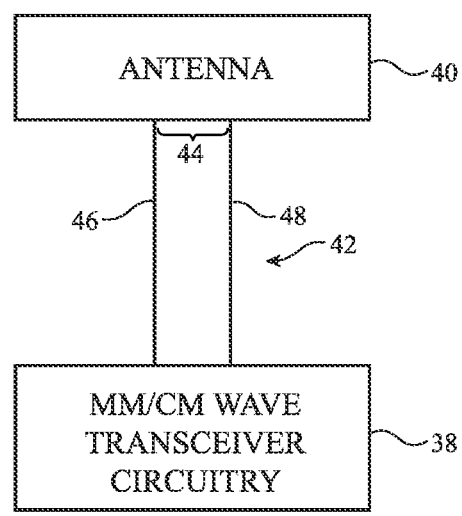
FIG. 3 is a schematic diagram of illustrative wireless circuitry in accordance with some embodiments.

A schematic diagram of an antenna 40 that may be formed in a phased antenna array for conveying radio-frequency signals at millimeter and centimeter wave frequencies is shown in FIG. 3. As shown in FIG. 3, antenna 40 may be coupled to millimeter/centimeter (MM/CM) wave transceiver circuitry 38. Millimeter/centimeter wave transceiver circuitry 38 may be coupled to antenna feed 44 of antenna 40 using a transmission line path that includes radio-frequency transmission line 42. Radio-frequency transmission line 42 may include a positive signal conductor such as signal conductor 46 and may include a ground conductor such as ground conductor 48. Ground conductor 48 may be coupled to the antenna ground for antenna 40 (e.g., over a ground antenna feed terminal of antenna feed 44 located at the antenna ground). Signal conductor 46 may be coupled to the antenna resonating element for antenna 40. For example, signal conductor 46 may be coupled to a positive antenna feed terminal of antenna feed 44 located at the antenna resonating element.

In another suitable arrangement, antenna 40 may be a probe-fed antenna that is fed using a feed probe. In this arrangement, antenna feed 44 may be implemented as a feed probe. Signal conductor 46 may be coupled to the feed probe. Radio-frequency transmission line 42 may convey radio-frequency signals to and from the feed probe. When radio-frequency signals are being transmitted over the feed probe and the antenna, the feed probe may excite the resonating element for the antenna (e.g., may excite electromagnetic resonant modes of a dielectric antenna resonating element for antenna 40). The resonating element may radiate the radio-frequency signals in response to excitation by the feed probe. Similarly, when radio-frequency signals are received by the antenna (e.g., from free space), the radio-frequency signals may excite the resonating element for the antenna (e.g., may excite electromagnetic resonant modes of the dielectric antenna resonating element for antenna 40). This may produce antenna currents on the feed probe and the corresponding radio-frequency signals may be passed to the transceiver circuitry over the radio-frequency transmission line.

Radio-frequency transmission line 42 may include a stripline transmission line (sometimes referred to herein simply as a stripline), a coaxial cable, a coaxial probe realized by metalized vias, a microstrip transmission line, an edge-coupled microstrip transmission line, an edge-coupled stripline transmission lines, a waveguide structure, combinations of these, etc. Multiple types of transmission lines may be used to form the transmission line path that couples millimeter/centimeter wave transceiver circuitry 38 to antenna feed 44. Filter circuitry, switching circuitry, impedance matching circuitry, phase shifter circuitry, amplifier circuitry, and/or other circuitry may be interposed on radio-frequency transmission line 42, if desired.

Radio-frequency transmission lines in device 10 may be integrated into ceramic substrates, rigid printed circuit boards, and/or flexible printed circuits. In one suitable arrangement, radio-frequency transmission lines in device 10 may be integrated within multilayer laminated structures (e.g., layers of a conductive material such as copper and a dielectric material such as a resin that are laminated together without intervening adhesive) that may be folded or bent in multiple dimensions (e.g., two or three dimensions) and that maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Figure 4:
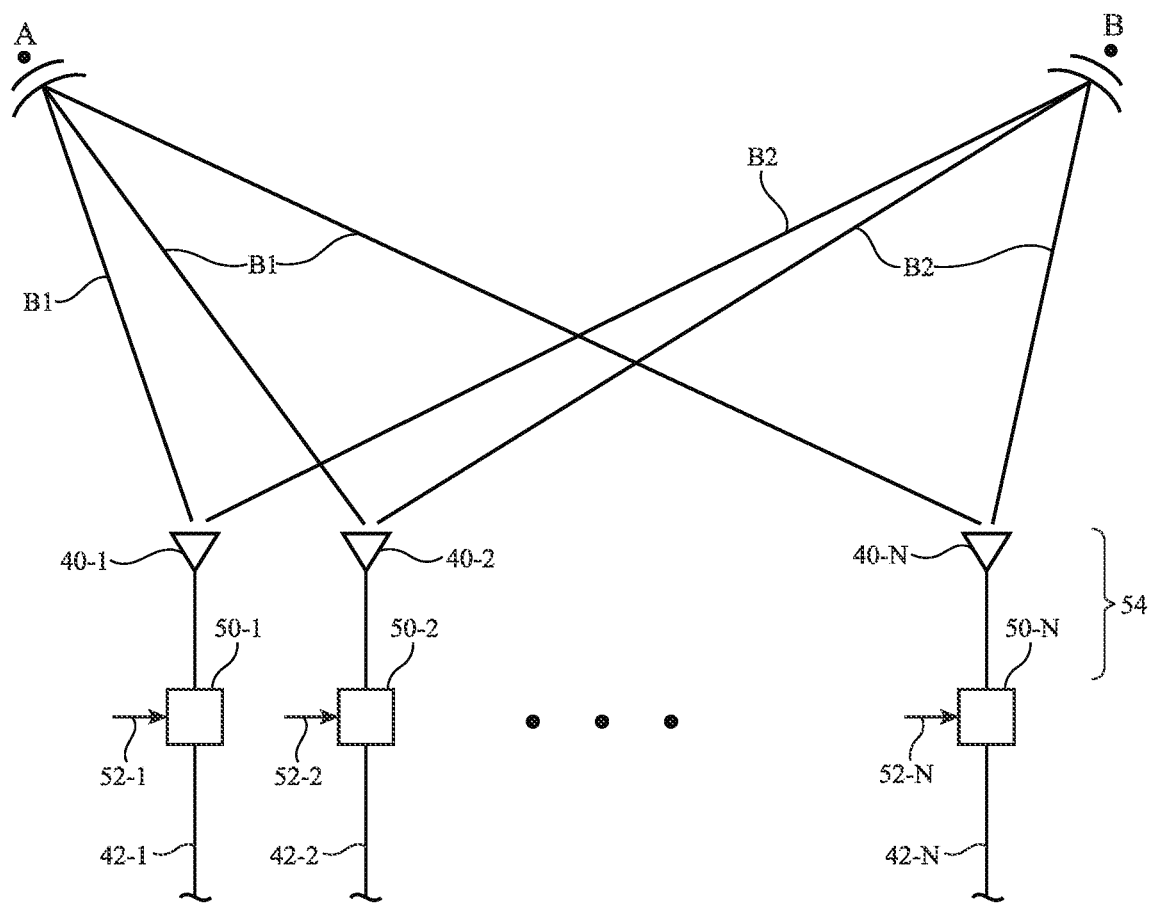
FIG. 4 is a diagram of an illustrative phased antenna array that may be adjusted using control circuitry to direct a beam of signals in accordance with some embodiments.

FIG. 4 shows how antennas 40 for handling radio-frequency signals at millimeter and centimeter wave frequencies may be formed in a phased antenna array. As shown in FIG. 4, phased antenna array 54 (sometimes referred to herein as array 54, antenna array 54, or array 54 of antennas 40) may be coupled to radio-frequency transmission lines 42. For example, a first antenna 40-1 in phased antenna array 54 may be coupled to a first radio-frequency transmission line 42-1, a second antenna 40-2 in phased antenna array 54 may be coupled to a second radio-frequency transmission line 42-2, an Nth antenna 40-N in phased antenna array 54 may be coupled to an Nth radio-frequency transmission line 42-N, etc. While antennas 40 are described herein as forming a phased antenna array, the antennas 40 in phased antenna array 54 may sometimes also be referred to as collectively forming a single phased array antenna.

Antennas 40 in phased antenna array 54 may be arranged in any desired number of rows and columns or in any other desired pattern (e.g., the antennas need not be arranged in a grid pattern having rows and columns). During signal transmission operations, radio-frequency transmission lines 42 may be used to supply signals (e.g., radio-frequency signals such as millimeter wave and/or centimeter wave signals) from millimeter/centimeter wave transceiver circuitry 38 (FIG. 3) to phased antenna array 54 for wireless transmission. During signal reception operations, radio-frequency transmission lines 42 may be used to supply signals received at phased antenna array 54 (e.g., from external wireless equipment or transmitted signals that have been reflected off of external objects) to millimeter/centimeter wave transceiver circuitry 38 (FIG. 3).

The use of multiple antennas 40 in phased antenna array 54 allows beam steering arrangements to be implemented by controlling the relative phases and magnitudes (amplitudes) of the radio-frequency signals conveyed by the antennas. In the example of FIG. 4, antennas 40 each have a corresponding radio-frequency phase and magnitude controller 50 (e.g., a first phase and magnitude controller 50-1 interposed on radio-frequency transmission line 42-1 may control phase and magnitude for radio-frequency signals handled by antenna 40-1, a second phase and magnitude controller 50-2 interposed on radio-frequency transmission line 42-2 may control phase and magnitude for radio-frequency signals handled by antenna 40-2, an Nth phase and magnitude controller 50-N interposed on radio-frequency transmission line 42-N may control phase and magnitude for radio-frequency signals handled by antenna 40-N, etc.).

Phase and magnitude controllers 50 may each include circuitry for adjusting the phase of the radio-frequency signals on radio-frequency transmission lines 42 (e.g., phase shifter circuits) and/or circuitry for adjusting the magnitude of the radio-frequency signals on radio-frequency transmission lines 42 (e.g., power amplifier and/or low noise amplifier circuits). Phase and magnitude controllers 50 may sometimes be referred to collectively herein as beam steering circuitry (e.g., beam steering circuitry that steers the beam of radio-frequency signals transmitted and/or received by phased antenna array 54).

Phase and magnitude controllers 50 may adjust the relative phases and/or magnitudes of the transmitted signals that are provided to each of the antennas in phased antenna array 54 and may adjust the relative phases and/or magnitudes of the received signals that are received by phased antenna array 54. Phase and magnitude controllers 50 may, if desired, include phase detection circuitry for detecting the phases of the received signals that are received by phased antenna array 54. The term "beam" or "signal beam" may be used herein to collectively refer to wireless signals that are transmitted and received by phased antenna array 54 in a particular direction. The signal beam may exhibit a peak gain that is oriented in a particular pointing direction at a corresponding pointing angle (e.g., based on constructive and destructive interference from the combination of signals from each antenna in the phased antenna array). The term "transmit beam" may sometimes be used herein to refer to radio-frequency signals that are transmitted in a particular direction whereas the term "receive beam" may sometimes be used herein to refer to radio-frequency signals that are received from a particular direction. If, for example, phase and magnitude controllers 50 are adjusted to produce a first set of phases and/or magnitudes for transmitted radio-frequency signals, the transmitted signals will form a transmit beam as shown by beam B1 of FIG. 4 that is oriented in the direction of point A. If, however, phase and magnitude controllers 50 are adjusted to produce a second set of phases and/or magnitudes for the transmitted signals, the transmitted signals will form a transmit beam as shown by beam B2 that is oriented in the direction of point B. Similarly, if phase and magnitude controllers 50 are adjusted to produce the first set of phases and/or magnitudes, radio-frequency signals (e.g., radio-frequency signals in a receive beam) may be received from the direction of point A, as shown by beam B1. If phase and magnitude controllers 50 are adjusted to produce the second set of phases and/or magnitudes, radio-frequency signals may be received from the direction of point B, as shown by beam B2.

Each phase and magnitude controller 50 may be controlled to produce a desired phase and/or magnitude based on a corresponding control signal 52 received from control circuitry 28 of FIG. 2 (e.g., the phase and/or magnitude provided by phase and magnitude controller 50-1 may be controlled using control signal 52-1, the phase and/or magnitude provided by phase and magnitude controller 50-2 may be controlled using control signal 52-2, etc.). If desired, the control circuitry may actively adjust control signals 52 in real time to steer the transmit or receive beam in different desired directions over time. Phase and magnitude controllers 50 may provide information identifying the phase of received signals to control circuitry 28 if desired. A codebook on device 10 may map each beam pointing angle to a corresponding set of phase and magnitude values to be provided to phase and magnitude controllers 50 (e.g., the control circuitry may generate control signals 52 based on information from the codebook).

When performing wireless communications using radio-frequency signals at millimeter and centimeter wave frequencies, the radio-frequency signals are conveyed over a line of sight path between phased antenna array 54 and external communications equipment. If the external object is located at point A of FIG. 4, phase and magnitude controllers 50 may be adjusted to steer the signal beam towards point A (e.g., to steer the pointing direction of the signal beam towards point A). Phased antenna array 54 may transmit and receive radio-frequency signals in the direction of point A. Similarly, if the external communications equipment is located at point B, phase and magnitude controllers 50 may be adjusted to steer the signal beam towards point B (e.g., to steer the pointing direction of the signal beam towards point B). Phased antenna array 54 may transmit and receive radio-frequency signals in the direction of point B. In the example of FIG. 4, beam steering is shown as being performed over a single degree of freedom for the sake of simplicity (e.g., towards the left and right on the page of FIG. 4). However, in practice, the beam may be steered over two or more degrees of freedom (e.g., in three dimensions, into and out of the page and to the left and right on the page of FIG. 4). Phased antenna array 54 may have a corresponding field of view over which beam steering can be performed (e.g., in a hemisphere or a segment of a hemisphere over the phased antenna array). If desired, device 10 may include multiple phased antenna arrays that each face a different direction to provide coverage from multiple sides of the device.

Figure 5:
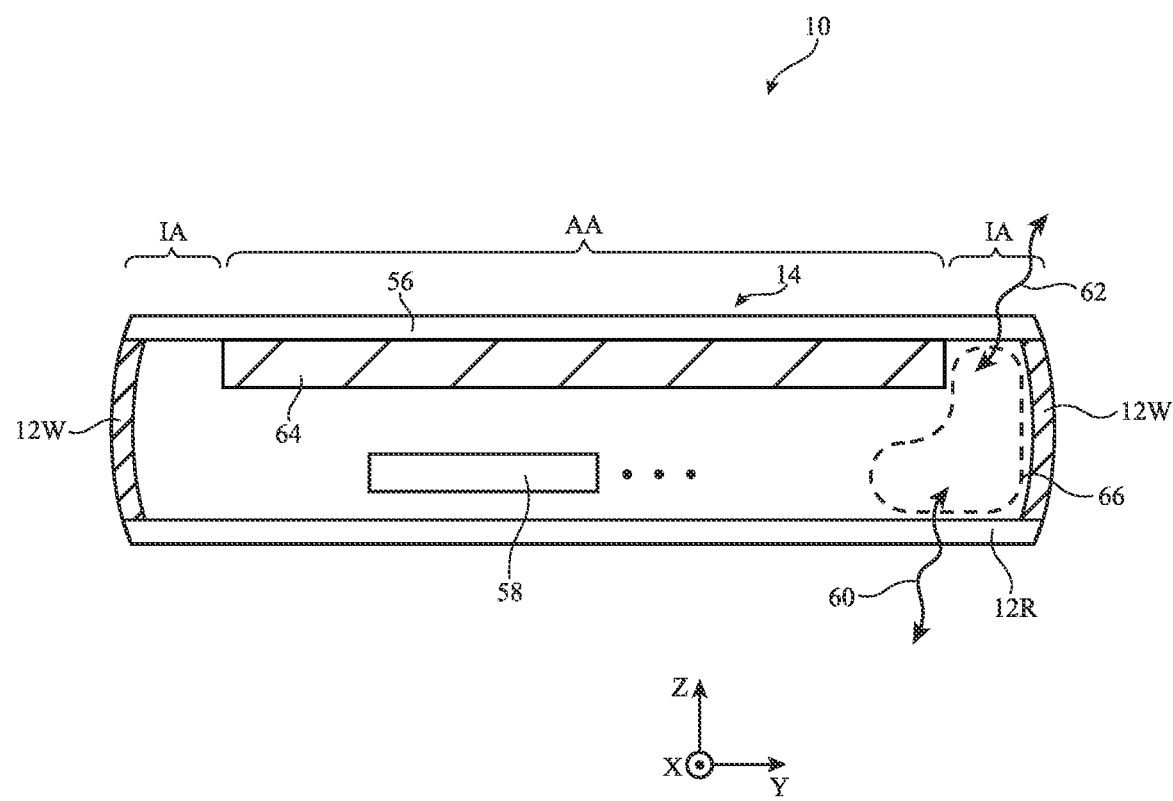
FIG. 5 is a cross-sectional side view of an illustrative electronic device having phased antenna arrays for radiating through different sides of the device in accordance with some embodiments.

FIG. 5 is a cross-sectional side view of device 10 in an example where device 10 has multiple phased antenna arrays. As shown in FIG. 5, peripheral conductive housing structures 12W may extend around the (lateral) periphery of device 10 and may extend from rear housing wall 12R to display 14. Display 14 may have a display module such as display module 64 (sometimes referred to as a display panel or conductive display structures). Display module 64 may include pixel circuitry, touch sensor circuitry, force sensor circuitry, and/or any other desired circuitry for forming active area AA of display 14. Display 14 may include a dielectric cover layer such as display cover layer 56 that overlaps display module 64. Display module 64 may emit image light and may receive sensor input through display cover layer 56. Display cover layer 56 and display 14 may be mounted to peripheral conductive housing structures 12W. The lateral area of display 14 that does not overlap display module 64 may form inactive area IA of display 14.

Device 10 may include multiple phased antenna arrays (e.g., phased antenna arrays 54 of FIG. 4). For example, device 10 may include a rear-facing phased antenna array. The rear-facing phased antenna array may be adhered to rear housing wall 12R using adhesive, may be pressed against (e.g., in contact with) rear housing wall 12R, or may be spaced apart from rear housing wall 12R. The rear-facing phased antenna array may transmit and/or receive radio-frequency signals 60 at millimeter and centimeter wave frequencies through rear housing wall 12R. In scenarios where rear housing wall 12R includes metal portions, radio-frequency signals 60 may be conveyed through an aperture or opening in the metal portions of rear housing wall 12R or may be conveyed through other dielectric portions of rear housing wall 12R. The aperture may be overlapped by a dielectric cover layer or dielectric coating that extends across the lateral area of rear housing wall 12R (e.g., between peripheral conductive housing structures 12W). The rear-facing phased antenna array may perform beam steering for radio-frequency signals 60 across at least some of the hemisphere below the rear face of device 10.

The field of view of the rear-facing phased antenna array is limited to the hemisphere under the rear face of device 10. Display module 64 and other components 58 (e.g., portions of input-output circuitry 24 or control circuitry 28 of FIG. 2, a battery for device 10, etc.) in device 10 include conductive structures. If care is not taken, these conductive structures may block radio-frequency signals from being conveyed by a phased antenna array within device 10 across the hemisphere over the front face of device 10. While a front-facing phased antenna array for covering the hemisphere over the front face of device 10 may be mounted against display cover layer 56 within inactive area IA, there may be insufficient space between the lateral periphery of display module 64 and peripheral conductive housing structures 12W to form all of the circuitry and radio-frequency transmission lines necessary to fully support the phased antenna array, particularly as the size of active area AA is maximized.

In order to mitigate these issues and provide coverage through the front face of device 10, a front-facing phased antenna array may be mounted within peripheral region 66 of device 10. The antennas in the front-facing phased antenna array may include dielectric resonator antennas. Dielectric resonator antennas may occupy less area in the X-Y plane of FIG. 5 than other types of antennas such as patch antennas and slot antennas. Implementing the antennas as dielectric resonator antennas may allow the radiating elements of the front-facing phased antenna array to fit within inactive area IA between display module 64 and peripheral conductive housing structures 12W. At the same time, the radio-frequency transmission lines and other components for the phased antenna array may be located behind (under) display module 64. The front-facing phased antenna array may transmit and/or receive radio-frequency signals 62 at millimeter and centimeter wave frequencies through display cover layer 56. The front-facing phased antenna array may perform beam steering for radio-frequency signals 62 across at least some of the hemisphere above the front face of device 10.

Device 10 may include both a front-facing phased antenna array (e.g., within peripheral region 66) and a rear-facing phased antenna array (e.g., within peripheral region 66 or elsewhere between display module 64 and rear housing wall 12R). If desired, device 10 may additionally or alternatively include one or more side-facing phased antenna arrays. The side-facing phased antenna arrays may be aligned with dielectric antenna windows in peripheral conductive housing structures 12W. The front, rear, and/or side-facing phased antenna arrays may be omitted if desired. The front and rear-facing phased antenna arrays (and optionally the side-facing phased antenna arrays) may collectively provide radio-frequency cover across an entire sphere around device 10.

The phased antenna array(s) 54 in device 10 may be formed in corresponding integrated antenna modules. Each antenna module may include a substrate such as a rigid printed circuit board substrate, a flexible printed circuit substrate, a plastic substrate, or a ceramic substrate, and one or more phased antenna arrays mounted to the substrate. Each antenna module may also include electronic components (e.g., radio-frequency components) that support the operations of the phased antenna array(s) therein. For example, each antenna module may include a radio-frequency integrated circuit (e.g., an integrated circuit chip) or other circuitry mounted to the corresponding substrate. Transmission line structures (e.g., radio-frequency signal traces), conductive vias, conductive traces, solder balls, or other conductive interconnect structures may couple the radio-frequency integrated circuit to each of the antennas in the phased antenna array(s) of the antenna module. The radio-frequency integrated circuit (RFIC) and/or other electronic components in the antenna module may include radio-frequency components such as amplifier circuitry, phase shifter circuitry (e.g., phase and magnitude controllers 50 of FIG. 4), and/or other circuitry that operates on radio-frequency signals. The rear-facing, front-facing, and/or side-facing phased antenna array(s) in device 10 may be formed within respective antenna modules. In another suitable arrangement, a rear-facing and front-facing phased antenna array may be formed as a part of the same antenna module in device 10.

Figure 6:
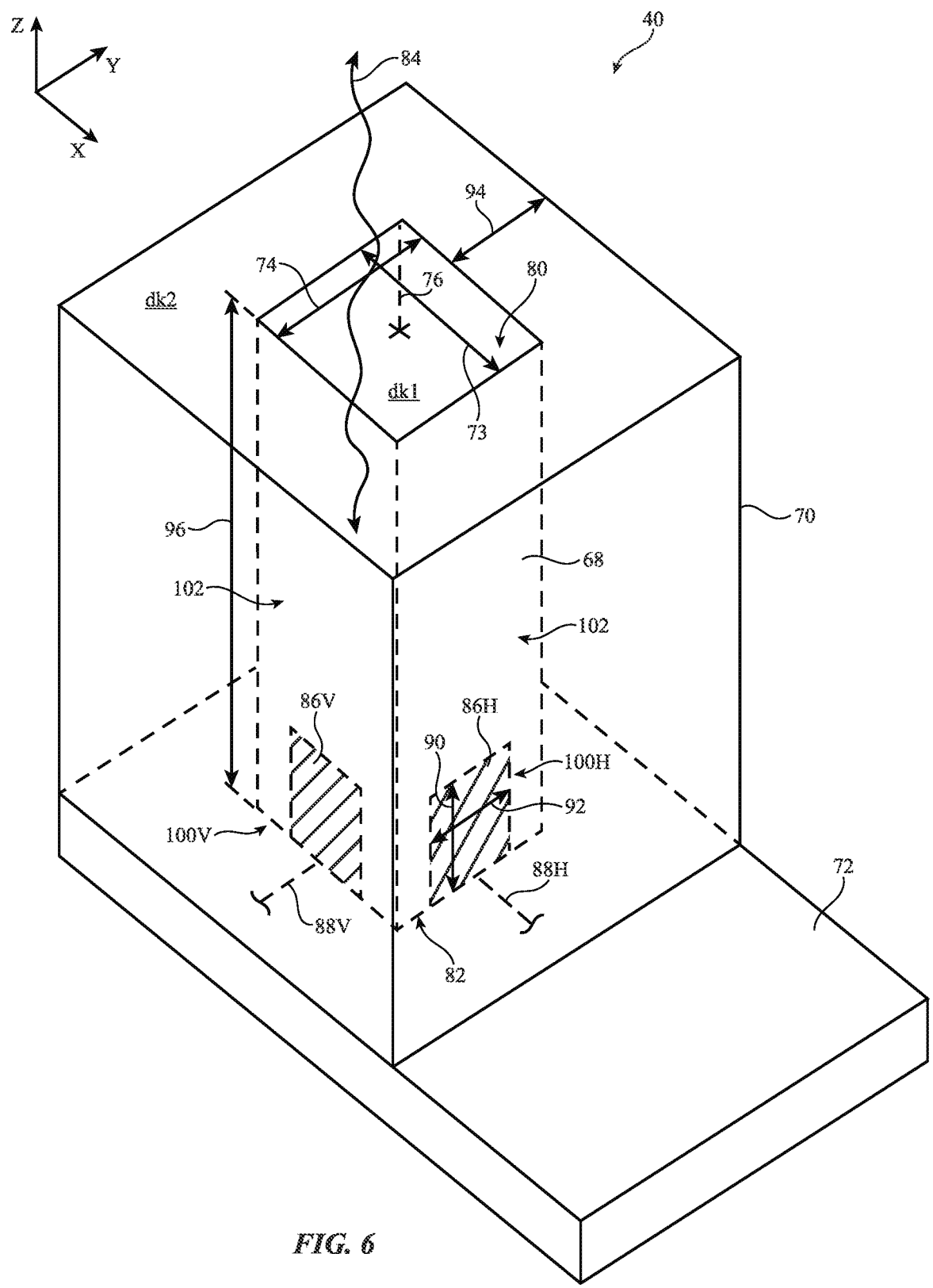
FIG. 6 is a perspective view of an illustrative probe-fed dielectric resonator antenna for covering multiple polarizations in accordance with some embodiments.

FIG. 6 is a perspective view of an illustrative probe-fed dielectric resonator antenna that may be used in forming the antennas of any of the phased antenna arrays in device 10. Antenna 40 of FIG. 6 may be a dielectric resonator antenna. In this example, antenna 40 includes a dielectric resonating element 68 mounted to an underlying substrate such as substrate 72. Substrate 72 may, for example, be the substrate of a corresponding antenna module in device 10. Substrate 72 may be a rigid printed circuit board substrate, a flexible printed circuit substrate, a ceramic substrate, a plastic substrate, or any other desired substrate.

In the example of FIG. 6, antenna 40 is a dual-polarization antenna that conveys both vertically and horizontally polarized radio-frequency signals 84 (e.g., linearly-polarized signals having orthogonal electric field orientations). This example is merely illustrative and, in another suitable arrangement, antenna 40 may only cover a single polarization. Antenna 40 may be fed using radio-frequency transmission lines that are formed on and/or embedded within flexible substrate 72 such as radio-frequency transmission lines 88 (e.g., a first radio-frequency transmission line 88V for conveying vertically-polarized signals and a second radio-frequency transmission line 88H for conveying horizontally-polarized signals). Radio-frequency transmission lines 88V and 88H may, for example, form part of radio-frequency transmission lines 42 of FIGS. 3 and 4. Radio-frequency transmission lines 88V and 88H may include ground traces (e.g., for forming part of ground conductor 48 of FIG. 3) and signal traces (e.g., for forming part of signal conductor 46 of FIG. 3) on and/or embedded within substrate 72. Radio-frequency transmission lines 88V and 88H may be coupled to a radio-frequency integrated circuit or other radio-frequency components on the antenna module that includes antenna 40.

Dielectric resonating element 68 of antenna 40 may be formed from a column (pillar) of dielectric material mounted to the top surface of substrate 72. If desired, dielectric resonating element 68 may be embedded within (e.g., laterally surrounded by) a dielectric substrate mounted to the top surface of substrate 72 such as dielectric substrate 70. Dielectric resonating element 68 may have a height 96 that extends from a bottom surface 82 at substrate 72 to an opposing top surface 80. Dielectric substrate 70 (sometimes referred to herein as over-mold structure 70) may extend across some or all of height 96. Top surface 80 may lie flush with the top surface of dielectric substrate 70, may protrude beyond the top surface of dielectric substrate 70, or dielectric substrate 70 may extend over and cover top surface 80 of dielectric resonating element 68.

The operating (resonant) frequency of antenna 40 may be selected by adjusting the dimensions of dielectric resonating element 68 (e.g., in the direction of the X, Y, and/or Z axes of FIG. 6). Dielectric resonating element 68 may be formed from a column of dielectric material having dielectric constant dk1. Dielectric constant dk1 may be relatively high (e.g., greater than 10.0, greater than 12.0, greater than 15.0, greater than 20.0, between 22.0 and 25.0, between 15.0 and 40.0, between 10.0 and 50.0, between 18.0 and 30.0, between 12.0 and 45.0, etc.). In one suitable arrangement, dielectric resonating element 68 may be formed from zirconia or a ceramic material. Other dielectric materials may be used to form dielectric resonating element 68 if desired.

Dielectric substrate 70 may be formed from a material having dielectric constant dk2. Dielectric constant dk2 may be less than dielectric constant dk1 of dielectric resonating element 68 (e.g., less than 18.0, less than 15.0, less than 10.0, between 3.0 and 4.0, less than 5.0, between 2.0 and 5.0, etc.). Dielectric constant dk2 may be less than dielectric constant dk1 by at least 10.0, 5.0, 15.0, 12.0, 6.0, etc. In one suitable arrangement, dielectric substrate 70 may be formed from molded plastic (e.g., injection molded plastic). Other dielectric materials may be used to form dielectric substrate 70 or dielectric substrate 70 may be omitted if desired. The difference in dielectric constant between dielectric resonating element 68 and dielectric substrate 70 may establish a radio-frequency boundary condition between dielectric resonating element 68 and dielectric substrate 70 from bottom surface 82 to top surface 80. This may configure dielectric resonating element 68 to serve as a resonating waveguide for propagating radio-frequency signals 84 at millimeter and centimeter wave frequencies.

Dielectric substrate 70 may have a width (thickness) 94 on some or all sides of dielectric resonating element 68. Width 94 may be selected to isolate dielectric resonating element 68 from surrounding device structures and/or from other dielectric resonating elements in the same antenna module and to minimize signal reflections in dielectric substrate 70. Width 94 may be, for example, at least one-tenth of the effective wavelength of the radio-frequency signals in a dielectric material of dielectric constant dk2. Width 94 may be 0.4-0.5 mm, 0.3-0.5 mm, 0.2-0.6 mm, greater than 0.1 mm, greater than 0.3 mm, 0.2-2.0 mm, 0.3-1.0 mm, or greater than between 0.4 and 0.5 mm, just as a few examples.

Dielectric resonating element 68 may radiate radio-frequency signals 84 when excited by the signal conductor for radio-frequency transmission lines 88V and/or 88H. In some scenarios, a slot is formed in ground traces on substrate 72, the slot is indirectly fed by a signal conductor embedded within substrate 72, and the slot excites dielectric resonating element 68 to radiate radio-frequency signals 84. However, in these scenarios, the radiating characteristics of the antenna may be affected by how the dielectric resonating element is mounted to substrate 72. For example, air gaps or layers of adhesive used to mount the dielectric resonating element to the flexible printed circuit can be difficult to control and can undesirably affect the radiating characteristics of the antenna. In order to mitigate the issues associated with exciting dielectric resonating element 68 using an underlying slot, antenna 40 may be fed using one or more radio-frequency feed probes 100 such as feed probes 100V and 100H of FIG. 6. Feed probes 100 may form part of the antenna feeds for antenna 40 (e.g., antenna feed 44 of FIG. 3).

As shown in FIG. 6, feed probe 100V may be formed from conductive structure 86V and feed probe 100H may be formed from conductive structure 86H. Conductive structure 86V may include a first portion patterned onto or pressed against a first sidewall 102 of dielectric resonating element 68. If desired, conductive structure 86V may also include a second portion on the surface of substrate 72 and the second portion may be coupled to the signal traces of radio-frequency transmission line 88V (e.g., using solder, welds, conductive adhesive, etc.). The second portion of conductive structure 86V may be omitted if desired (e.g., the signal traces in radio-frequency transmission line 88V may be soldered directly to the portion of conductive structure 86V on the first sidewall 102). Conductive structure 86V may include conductive traces patterned directly onto the first sidewall 102 or may include stamped sheet metal in scenarios where conductive structure 86V is pressed against the first sidewall 102, as examples.

The signal traces in radio-frequency transmission line 88V may convey radio-frequency signals to and from feed probe 100V. Feed probe 100V may electromagnetically couple the radio-frequency signals on the signal traces of radio-frequency transmission line 88V into dielectric resonating element 68. This may serve to excite one or more electromagnetic modes (e.g., radio-frequency cavity or waveguide modes) of dielectric resonating element 68. When excited by feed probe 100V, the electromagnetic modes of dielectric resonating element 68 may configure the dielectric resonating element to serve as a waveguide that propagates the wavefronts of radio-frequency signals 84 along the height of dielectric resonating element 68 (e.g., in the direction of the Z-axis and along the central/longitudinal axis 76 of dielectric resonating element 68). The radio-frequency signals 84 conveyed by feed probe 100V may be vertically polarized.

Similarly, conductive structure 86H may include a first portion patterned onto or pressed against a second sidewall 102 of dielectric resonating element 68. If desired, conductive structure 86H may also include a second portion on the surface of substrate 72 and the second portion may be coupled to the signal traces of radio-frequency transmission line 88H (e.g., using solder, welds, conductive adhesive, etc.). The second portion of conductive structure 86H may be omitted if desired (e.g., the signal traces in radio-frequency transmission line 88H may be soldered directly to the conductive structure 86H on sidewall 102). Conductive structure 86H may include conductive traces patterned directly onto the second sidewall 102 or may include stamped sheet metal in scenarios where conductive structure 86H is pressed against the second sidewall 102, as examples.

The signal traces in radio-frequency transmission line 88H may convey radio-frequency signals to and from feed probe 100H. Feed probe 100H may electromagnetically couple the radio-frequency signals on the signal traces of radio-frequency transmission line 88H into dielectric resonating element 68. This may serve to excite one or more electromagnetic modes (e.g., radio-frequency cavity or waveguide modes) of dielectric resonating element 68. When excited by feed probe 100H, the electromagnetic modes of dielectric resonating element 68 may configure the dielectric resonating element to serve as a waveguide that propagates the wavefronts of radio-frequency signals 84 along the height of dielectric resonating element 68 (e.g., along central/longitudinal axis 76 of dielectric resonating element 68). The radio-frequency signals 84 conveyed by feed probe 100H may be horizontally polarized.

Similarly, during signal reception, radio-frequency signals 84 may be received by antenna 40. The received radio-frequency signals may excite the electromagnetic modes of dielectric resonating element 68, resulting in the propagation of the radio-frequency signals down the height of dielectric resonating element 68. Feed probe 100V may couple the received vertically-polarized signals onto radio-frequency transmission line 88V. Feed probe 100H may couple the received horizontally-polarized signals onto radio-frequency transmission line 88H. Radio-frequency transmission lines 88H and 88V may pass the received radio-frequency signals to millimeter/centimeter wave transceiver circuitry (e.g., millimeter/centimeter wave transceiver circuitry 38 of FIGS. 2 and 3) through the radio-frequency integrated circuit for antenna 40. The relatively large difference in dielectric constant between dielectric resonating element 68 and dielectric substrate 70 may allow dielectric resonating element 68 to convey radio-frequency signals 84 with a relatively high antenna efficiency (e.g., by establishing a strong boundary between dielectric resonating element 68 and dielectric substrate 70 for the radio-frequency signals). The relatively high dielectric constant of dielectric resonating element 68 may also allow the dielectric resonating element 68 to occupy a relatively small volume compared to scenarios where materials with a lower dielectric constant are used.

The dimensions of feed probes 100V and 100H (e.g., height 90 and width 92 on sidewalls 102) may be selected to help match the impedance of radio-frequency transmission lines 88V and 88H to the impedance of dielectric resonating element 68. As an example, width 92 may be between 0.3 mm and 0.7 mm, between 0.2 mm and 0.8 mm, between 0.4 mm and 0.6 mm, or other values. Height 90 may be between 0.3 mm and 0.7 mm, between 0.2 mm and 0.8 mm, between 0.4 mm and 0.6 mm, or other values. Height 90 may be equal to width 92 or may be different than width 92. Feed probes 100V and 100H may sometimes be referred to herein as feed conductors, feed patches, or probe feeds. Dielectric resonating element 68 may sometimes be referred to herein as a dielectric radiating element, dielectric radiator, dielectric resonator, dielectric antenna resonating element, dielectric column, dielectric pillar, radiating element, or resonating element. When fed by one or more feed probes such as feed probes 100V and 100H, dielectric resonator antennas such as antenna 40 of FIG. 6 may sometimes be referred to herein as probe-fed dielectric resonator antennas.

Antenna 40 may be included in a rear-facing, front-facing, or side-facing phased antenna array in device 10 (e.g., radio-frequency signals 84 may form radio-frequency signals 62 or 60 of FIG. 5). In scenarios where antenna 40 is formed in a front-facing phased antenna array, top surface 80 may be pressed against, adhered to, or separated from display cover layer 56 of FIG. 5. In scenarios where antenna 40 is formed in a rear-facing phased antenna array, top surface 80 may be pressed against, adhered to, or separated from rear housing wall 12R of FIG. 5. An optional impedance matching layer may be interposed between top surface 80 and rear housing wall 12R or display cover layer 56. The impedance matching layer may have a dielectric constant that is between dielectric constant dk1 and the dielectric constant of rear housing wall 12R or display cover layer 56. If desired, the dielectric constant and thickness of the impedance matching layer may be selected to configure the impedance matching layer to form a quarter-wave impedance transformer for antenna 40 at the frequencies of operation of antenna 40. This may configure the impedance matching layer to help minimize signal reflections at the interfaces between top surface 80 and free space exterior to device 10.

If desired, radio-frequency transmission lines 88V and 88H may include impedance matching structures (e.g., transmission line stubs) to help match the impedance of dielectric resonating element 68. Both feed probes 100H and 100V may be active at once so that antenna 40 conveys both vertically and horizontally polarized signals at any given time. If desired, the phases of the signals conveyed by feed probes 100H and 100V may be independently adjusted so that antenna 40 conveys radio-frequency signals 84 with an elliptical or circular polarization. In another suitable arrangement, a single one of feed probes 100H and 100V may be active at once so that antenna 40 conveys radio-frequency signals of only a single polarization at any given time. In another suitable arrangement, antenna 40 may be a single-polarization antenna where radio-frequency transmission line 88V and feed probe 100V have been omitted.

As shown in FIG. 6, dielectric resonating element 68 may have a height 96, a length 74, and a width 73. Length 74, width 73, and height 96 may be selected to provide dielectric resonating element 68 with a corresponding mix of electromagnetic cavity/waveguide modes that, when excited by feed probes 100H and/or 100V, configure antenna 40 to radiate at desired frequencies. For example, height 96 may be 2-10 mm, 4-6 mm, 3-7 mm, 4.5-5.5 mm, or greater than 2 mm. Width 73 and length 74 may each be 0.5-1.0 mm, 0.4-1.2 mm, 0.7-0.9 mm, 0.5-2.0 mm, 1.5 mm-2.5 mm, 1.7 mm-1.9 mm, 1.0 mm-3.0 mm, etc. Width 73 may be equal to length 74 (e.g., dielectric resonating element 68 may have a square-shaped lateral profile in the X-Y plane) or, in other arrangements, may be different than length 74 (e.g., dielectric resonating element 68 may have a rectangular or non-rectangular lateral profile in the X-Y plane). Sidewalls 102 of dielectric resonating element 68 may directly contact the surrounding dielectric substrate 70. Dielectric substrate 70 may be molded over feed probes 100H and 100V or may include openings, notches, or other structures that accommodate the presence of feed probes 100H and 100V. Each sidewall 102 may be planar or, if desired, one or more sidewall 102 may have a non-planar shape (e.g., a shape with planar and curved portions, a planar shape with a notch or recessed portion, etc.). The example of FIG. 6 is merely illustrative and, if desired, dielectric resonating element 68 may have other shapes (e.g., shapes with any desired number of straight and/or curved sidewalls 102).

In practice, if care is not taken, dielectric resonator antennas such as antenna 40 can be subject to undesirable cross-polarization interference. Cross-polarization interference can occur when radio-frequency signals to be conveyed in a first polarization are undesirably transmitted or received using an antenna feed that is used to convey radio-frequency signals in a second polarization. For example, cross-polarization interference may involve the leakage of horizontally-polarized signals onto feed probe 100V of FIG. 6 (e.g., a feed probe intended to convey vertically-polarized signals) and/or the leakage of vertically-polarized signals onto feed probe 100H of FIG. 6 (e.g., a feed probe intended to convey horizontally-polarized signals). The cross-polarization interference can arise when the electric field produced by feed probe 100V has components oriented at a mix of different angles or when the electric field produced by feed probe 100H has components oriented at a mix of different angles within dielectric resonating element 68. Cross-polarization interference can lead to a decrease in overall data throughput, errors in the transmitted or received data, or otherwise degraded antenna performance. These effects are also particularly detrimental in scenarios where antenna 40 conveys independent data streams using horizontal and vertical polarizations (e.g., under a MIMO scheme), as the cross-polarization interference reduces the independence of the data streams. It would therefore be desirable to be able to provide a dielectric resonator antenna such as antenna 40 with structures for mitigating cross polarization interference (e.g., for maximizing isolation between polarizations handled by the antenna).

Figure 7:
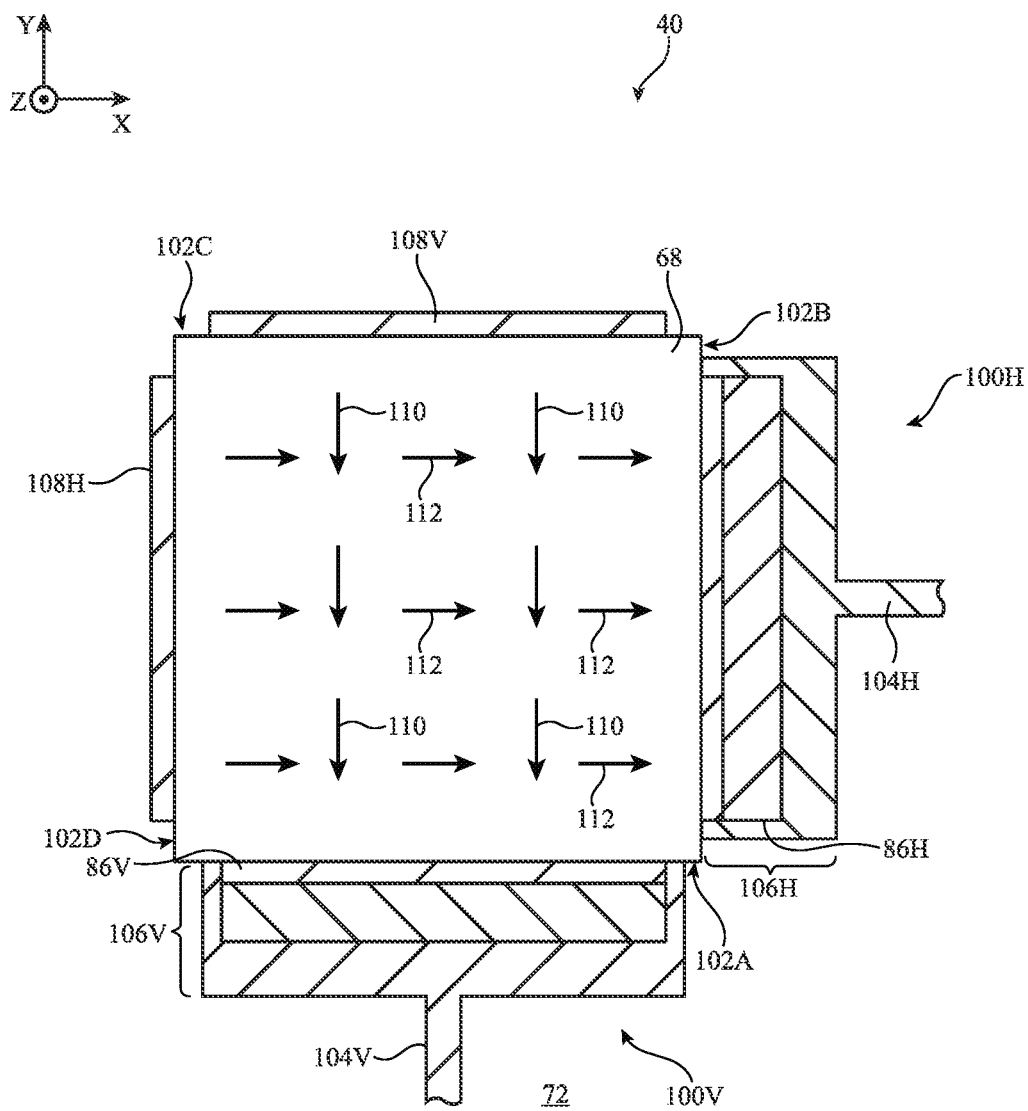
FIG. 7 is a top-down view of an illustrative probe-fed dielectric resonator antenna having multiple feed probes and floating parasitic patches for mitigating cross-polarization interference in accordance with some embodiments.

FIG. 7 is a top-down view of antenna 40 having structures for mitigating cross polarization interference. In the example of FIG. 7, antenna 40 is a dual-polarization dielectric resonator antenna having feed probes 100V and 100H for exciting different polarizations of dielectric resonating element 68.

As shown in FIG. 7, dielectric resonating element 68 may have a rectangular lateral profile. Dielectric resonating element 68 may have four sidewalls 102 (e.g., four vertical faces or surfaces oriented perpendicular to the X-Y plane) such as a first sidewall 102A, a second sidewall 102B, a third sidewall 102C, and a fourth sidewall 102D. Third sidewall 102C may oppose first sidewall 102A and fourth sidewall 102D may oppose second sidewall 102B on dielectric resonating element 68. Conductive structure 86V of feed probe 100V may be patterned onto or pressed against first sidewall 102A. Conductive structure 86V may also be coupled to conductive trace 106V on the underlying substrate 72 (e.g., using solder, welds, conductive adhesive, etc.). Conductive trace 106V may be coupled to conductive trace 104V. Conductive traces 104V and 106V may form part of the signal conductor for radio-frequency transmission line 88V of FIG. 6. Similarly, conductive structure 86H of feed probe 100H may be patterned onto or pressed against second sidewall 102B. Conductive structure 86H may also be coupled to conductive trace 106H on substrate 72 (e.g., using solder, welds, conductive adhesive, etc.). Conductive traces 106H may be coupled to conductive trace 104H. Conductive traces 104H and 106H may form part of the signal conductor for radio-frequency transmission line 88H of FIG. 6.

In order to mitigate cross polarization interference, parasitic elements such as parasitic elements 108H and 108V may be patterned onto the sidewalls of dielectric resonating element 68. Parasitic elements 108H and 108V may, for example, be formed from floating patches of conductive material patterned onto or pressed against the sidewalls of dielectric resonating element 68 (e.g., conductive patches that are not coupled to ground or the signal traces for antenna 40). As shown in FIG. 7, parasitic element 108H may be patterned onto or pressed against fourth sidewall 102D opposite feed probe 100H. Parasitic element 108V may be patterned onto or pressed against third sidewall 102C opposite first feed probe 100V.

The presence of the conductive material in parasitic element 108H may serve to change the boundary condition for the electric field excited by feed probe 100H within dielectric resonating element 68. For example, in scenarios where parasitic element 108H is omitted, the electric field excited by feed probe 100H may include a mix of different electric field components oriented in different directions. This may lead to cross-polarization interference in which some vertically-polarized signals undesirably leak onto feed probe 100H. However, the boundary condition created by parasitic element 108H may serve to align the electric field excited by feed probe 100H in a single direction between sidewalls 102B and 102D, as shown by arrows 112 (e.g., in a horizontal direction parallel to the X-axis). Because the entire electric field excited by feed probe 100H is horizontal, feed probe 100H may only convey horizontally-polarized signals without vertically-polarized signals interfering with the horizontally-polarized signals.

Similarly, the presence of the conductive material in parasitic element 108V may serve to change the boundary condition for the electric field excited by feed probe 100V within dielectric resonating element 68. For example, in scenarios where parasitic element 108V is omitted, the electric field excited by feed probe 100V may include a mix of different electric field components oriented in different directions. This may lead to cross-polarization interference in which some horizontally-polarized signals undesirably leak onto feed probe 100V. However, the boundary condition created by parasitic element 108V may serve to align the electric field excited by feed probe 100V in a single direction between sidewalls 102A and 102C, as shown by arrows 110 (e.g., in a vertical direction parallel to the Y-axis). Because the entire electric field excited by feed probe 100V is vertical, feed probe 100V may only convey vertically-polarized signals without horizontally-polarized signals interfering with the vertically-polarized signals.

Parasitic element 108V may have a shape (e.g., lateral dimensions in the X-Z plane) that matches the shape of the portion of conductive structure 86V on sidewall 102A (e.g., parasitic element 108V may have width 92 and height 90 of FIG. 6. Similarly, parasitic element 108H may have a shape (e.g., lateral dimensions in the Y-Z plane) that matches the shape of the portion of conductive structure 86H on sidewall 102B (e.g., parasitic element 108H may have width 92 and height 90 of FIG. 6). This may ensure that there are symmetric boundary conditions between feed probe 100V and parasitic element 108V and between feed probe 100H and parasitic element 108H. Parasitic element 108V need not have the same exact dimensions as feed probe 100V and parasitic element 108H need not have the same exact dimensions as feed probe 100H if desired.

Figure 8:
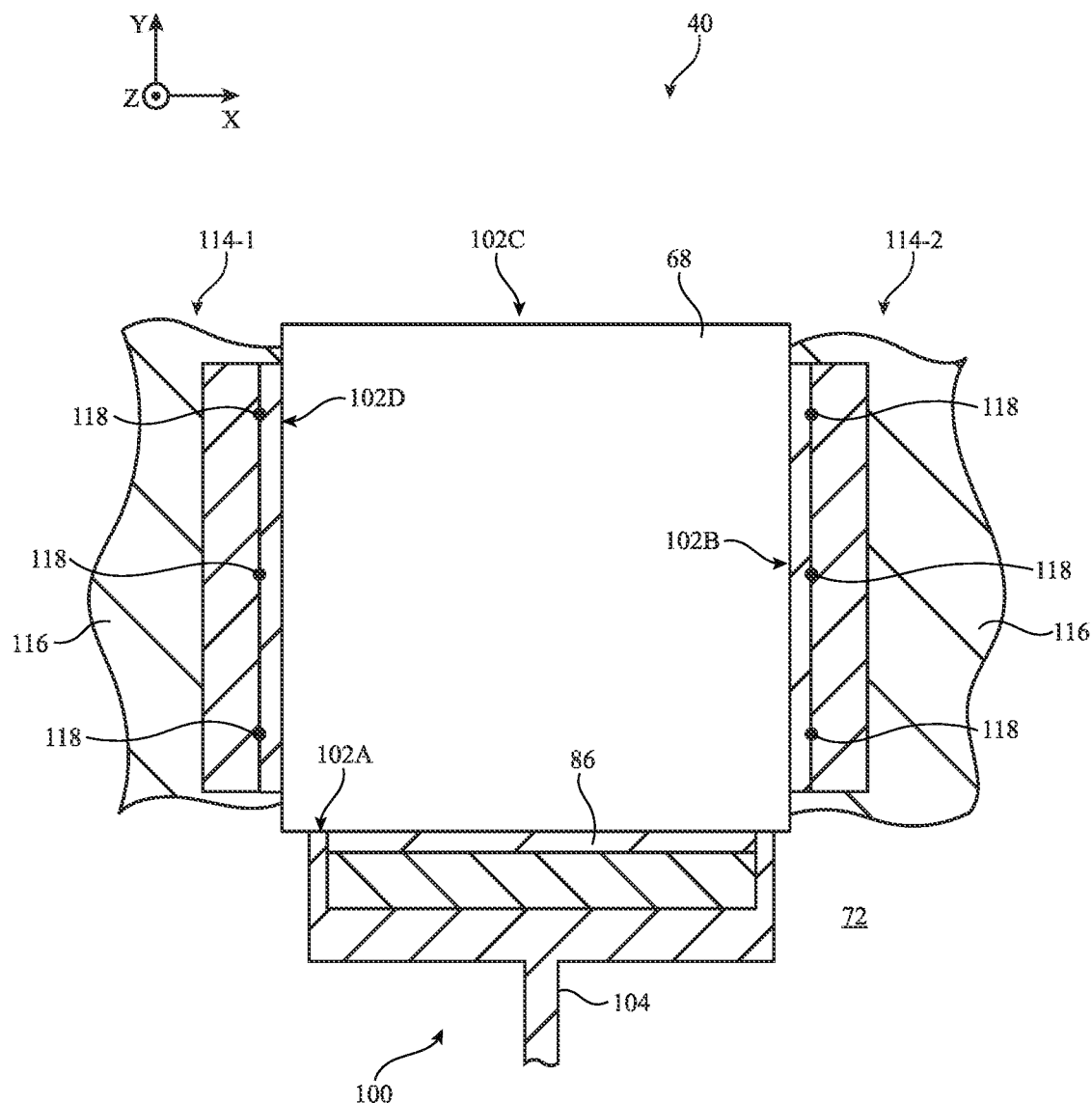
FIG. 8 is a top-down view of an illustrative probe-fed dielectric resonating antenna having a single feed probe and grounded parasitic patches for mitigating cross-polarization interference in accordance with some embodiments.

Antenna 40 may also include cross-polarization interference mitigating parasitic elements in scenarios where antenna 40 is fed using only a single feed probe. FIG. 8 is a top-down view showing how antenna 40 may include cross-polarization interference mitigating parasitic elements in an arrangement where antenna 40 is fed using only a single feed probe 100.

As shown in FIG. 8, antenna 40 may be fed using a single feed probe 100. Conductive structure 86 of feed probe 100 may be patterned onto sidewall 102A of dielectric resonating element 68. Conductive structure 86 may be coupled to conductive trace 104 on the underlying substrate 72. Ground traces such as ground traces 116 may also be patterned onto substrate 72.

Antenna 40 may include one or more parasitic elements 114 such as a first parasitic element 114-1 and a second parasitic element 114-2. Parasitic element 114-1 may be formed from a patch of conductive traces (e.g., a conductive patch) that is patterned onto sidewall 102D of dielectric resonating element 68. Parasitic element 114-2 may be formed from a patch of conductive traces (e.g., a conductive patch) that is patterned onto sidewall 102B of dielectric resonating element 68. Parasitic elements 114-1 and 114-2 may each have the same size and lateral dimensions (e.g., in the Y-Z plane) as conductive structure 86 (e.g., in the X-Z plane), for example. Parasitic element 114-1 and parasitic element 114-2 may each be coupled to ground traces 116 at substrate 72 by conductive interconnect structures 118. Conductive interconnect structures 118 may include solder, welds, conductive adhesive, conductive tape, conductive foam, conductive springs, conductive brackets, and/or any other desired conductive interconnect structures. In this way, parasitic elements 114-1 and 114-2 may each be held at a ground potential (e.g., parasitic elements 114-1 and 114-2 may be grounded patches). Parasitic element 114-1 may be omitted or parasitic element 114-2 may be omitted if desired (e.g., antenna 40 may include only a single parasitic element 114 if desired).

Parasitic element 114-1 and/or parasitic element 114-2 may serve to alter the electromagnetic boundary conditions of dielectric resonating element 68 to mitigate cross-polarization interference for feed probe 100 (e.g., to isolate feed probe 100 from interference from horizontally-polarized signals in scenarios where feed probe 100 handles vertically-polarized signals). Sidewall 102C of dielectric resonating element 68 may be free from conductive material such as parasitic elements 114.

Phased antenna array 54 of FIG. 4 (e.g., a front-facing phased antenna array for conveying radio-frequency signals 62 through display cover layer 56 of FIG. 5, a rear-facing phased antenna array for conveying radio-frequency signals 60 through rear housing wall 12R of FIG. 5, or a side-facing phased antenna array) may include any desired number of antennas 40 arranged in any desired pattern (e.g., a pattern having rows and columns). Each of the antennas 40 in phased antenna array 54 may be dielectric resonator antenna such as the probe-fed dielectric resonator antenna 40 of FIGS. 6-8 (e.g., having two feed probes 100V and 100H as shown in FIG. 6 and optionally parasitic elements 108V and 108H as shown in FIG. 7 or having one feed probe 100 and optionally parasitic elements 114-1 and 114-2 as shown in FIG. 8). Phased antenna array 54 may be formed as a part of an integrated antenna module.

Figure 9:
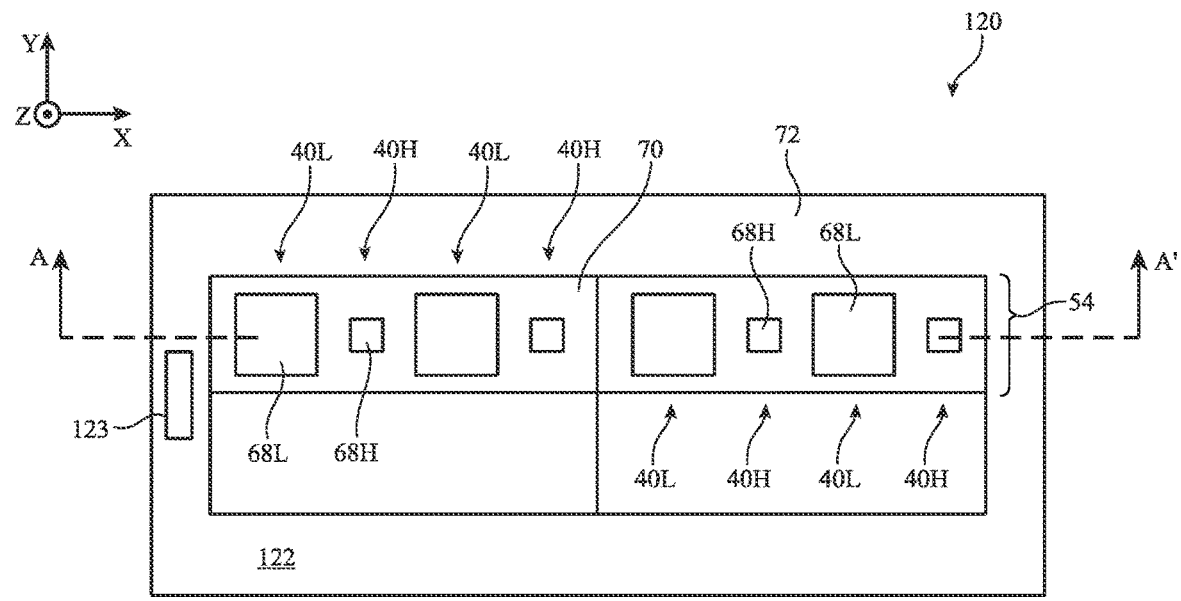
FIG. 9 is a top-down view of an illustrative antenna module having dielectric resonator antennas in accordance with some embodiments.

FIG. 9 is a top down view of an integrated antenna module that may include phased antenna array 54. As shown in FIG. 9, phased antenna array 54 may be formed as a part of an integrated antenna module such as antenna module 120. Antenna module 120 may include substrate 72. Phased antenna array 54 may be mounted to a surface of substrate 72 such as surface 122. A board-to-board connector such as connector 123 may also be mounted to surface 122.

In the example of FIG. 9, phased antenna array 54 is a dual-band phased antenna array having a first set of antennas 40L that convey radio-frequency signals in a first frequency band and a second set of antennas 40H that convey radio-frequency signals in a second frequency band that is higher than the first frequency band. Antennas 40H may therefore sometimes be referred to herein as high band antennas 40H whereas low band antennas 40L are sometimes referred to herein as low band antennas 40L. As just one example, the first frequency band may include frequencies between about 24 and 31 GHz and the second frequency band may include frequencies between about 37 and 41 GHz.

High band antennas 40H may be dielectric resonator antennas having dielectric resonating elements 68H embedded within dielectric substrate 70. Low band antennas 40L may be dielectric resonator antennas having dielectric resonating elements 68H embedded within dielectric substrate 70. Dielectric substrate 70 may be molded over and/or around dielectric resonating elements 68H and 68L and may be mounted to surface 122 of substrate 72. In order to support satisfactory beam forming, each high band antenna 40H may, for example, be separated from one or two adjacent high band antennas 40H in dielectric substrate 70 by a distance that is approximately equal to one-half of the effective wavelength corresponding to a frequency in the second frequency band (e.g., where the effective wavelength is equal to a free space wavelength multiplied by a constant value determined by the dielectric material surrounding the antennas). Similarly, each low band antenna 40L may, for example, be separated from one or two adjacent low band antennas 40L in dielectric substrate 70 by a distance that is approximately equal to one-half of the effective wavelength corresponding to a frequency in the first frequency band.

In the example of FIG. 9, phased antenna array 54 is a one-dimensional array having four high band antennas 40H interleaved (interspersed) with four low band antennas 40L arranged along a single longitudinal axis (e.g., running parallel to the X-axis). This is merely illustrative. Phased antenna array 54 may include any desired number of low band antennas 40L and/or high band antennas 40H and the antennas may be arranged in any desired one or two-dimensional pattern.

Figure 10:
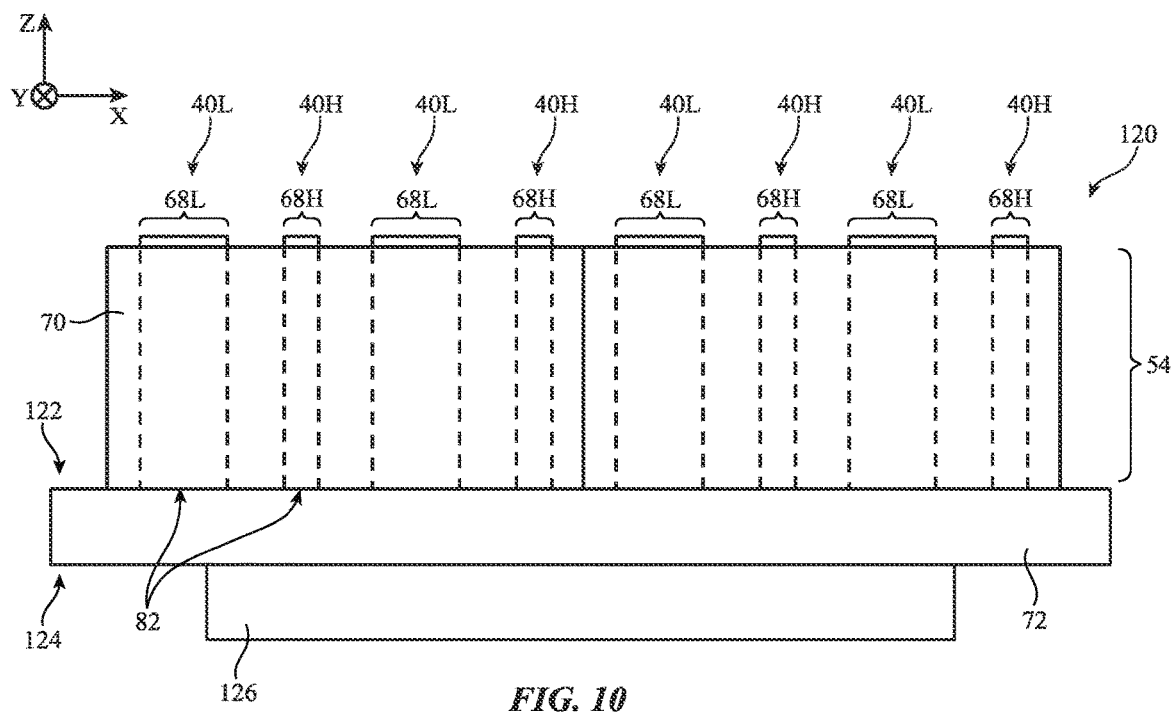
FIG. 10 is a cross-sectional side view of an illustrative antenna module having dielectric resonator antennas in accordance with some embodiments.

FIG. 10 is a cross-sectional side view of antenna module 120 (e.g., as taken in the direction of line AA' of FIG. 9). As shown in FIG. 10, the bottom surface 82 of the dielectric resonating elements 68L and 68H in phased antenna array 54 may be mounted to surface 122 of substrate 72. Dielectric substrate 70 may be molded over dielectric resonating elements 68L and 68H and may be mounted to surface 122. If desired, dielectric substrate 70 may be molded over every dielectric resonating element 68L and 68H in phased antenna array 54 to form a single integrated structure, and the single integrated structure may then be mounted (e.g., surface-mounted) to surface 122 of substrate 72. This may, for example, minimize mechanical variations between the antennas in phased antenna array 54 that could otherwise deteriorate antenna performance or mechanical reliability.

Substrate 72 may have a surface 124 opposite surface 122. Additional electronic components such as radio-frequency integrated circuit (RFIC) 126 may be mounted to surface 124 of substrate 72. An optional over-mold and/or shielding structures may be provided over RFIC 126 and surface 124 of substrate 72 (not shown in the example of FIG. 10 for the sake of clarity). RFIC 126 may have terminals or ports that are coupled to corresponding contact pads on surface 124 using solder balls, conductive adhesive, conductive pins, conductive springs, and/or any other desired conductive interconnect structures.

Radio-frequency transmission lines in substrate 72 (e.g., radio-frequency transmission lines 88V and 88H of FIG. 6) may couple the ports of RFIC 126 to the feed probes (e.g., feed probes 100V and 100H of FIG. 6) on dielectric resonating elements 68L and 68H. Dielectric substrate 72 may include multiple stacked dielectric substrate layers (e.g., layers of printed circuit board material, flexible printed circuit material, ceramic, etc.). The radio-frequency transmission lines in substrate 72 may include signal traces and ground traces on one or more of the stacked dielectric substrate layers (e.g., embedded within and/or on surfaces 122 and/or 124 of substrate 72) and/or conductive vias extending through one or more of the stacked dielectric substrate layers.

RFIC 126 may include, for example, phase and magnitude controllers 50 of FIG. 4, upconverter circuitry, down-converter circuitry, amplifier circuitry, or any other desired radio-frequency circuitry. RFIC 126 may include one or more additional ports or terminals that are coupled to connector 123 of FIG. 9 (e.g., using additional radio-frequency transmission line structures on substrate 72). RFIC 126 may be coupled to millimeter/centimeter wave transceiver circuitry 38 of FIGS. 2 and 3 via connector 123. Millimeter/centimeter wave transceiver circuitry 38 may be mounted to an additional substrate such as an additional rigid printed circuit board, a flexible printed circuit, the main logic board of device 10, etc. If desired, the signals conveyed between the millimeter/centimeter wave transceiver circuitry and RFIC 126 may be at an intermediate frequency (e.g., a radio frequency) that is greater than a baseband frequency and less than the frequencies with which antennas 40L and 40H convey radio-frequency signals. In these scenarios, upconverter circuitry in RFIC 126 may up-convert the signals from the intermediate frequency to the frequencies of operation of antennas 40L and 40H. Similarly, downconverter circuitry in RFIC 126 may down-convert signals received by antennas 40L and 40H to the intermediate frequency. RFIC 126 may, if desired, include multiple separate (discrete) radio-frequency integrated circuits mounted to substrate 72 (e.g., antenna module 120 may be an integrated circuit package that includes one or more RFICs and one or more phased antenna arrays mounted to a common/shared substrate such as substrate 72).

Figure 11:
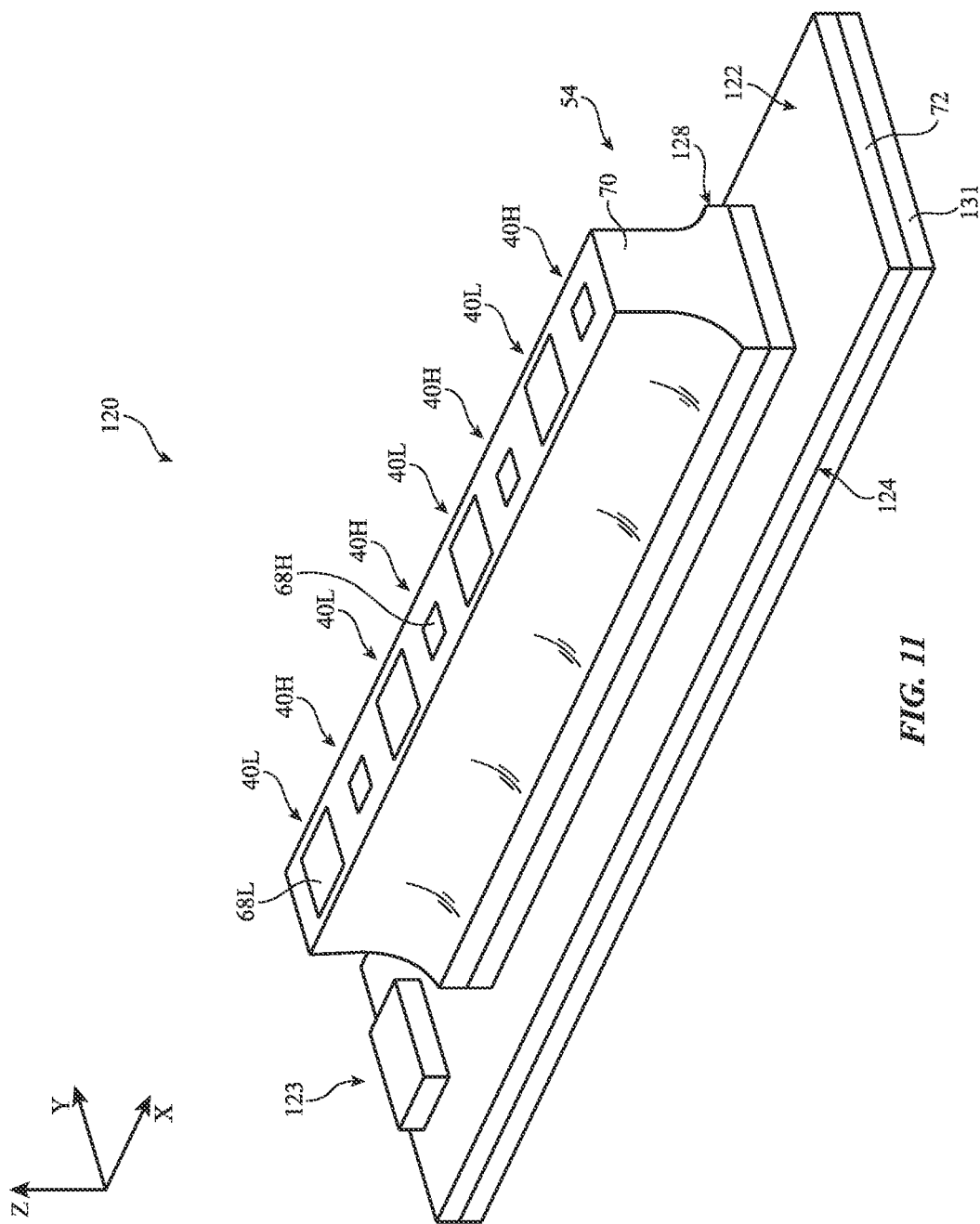
FIG. 11 is a perspective view of an illustrative antenna module having dielectric resonator antennas in accordance with some embodiments.

FIG. 11 is a perspective view of the antenna module 120 of FIGS. 9 and 10. As shown in FIG. 11, phased antenna array 54 (e.g., dielectric resonating elements 68L and 68H and dielectric substrate 70) may be mounted to surface 122 of substrate 72. Dielectric substrate 70 may have a foot structure 128 at surface 122 that is wider than the top surface of dielectric substrate 70 (e.g., to increase the mechanical stability of antenna module 120). If desired, phased antenna array 54 may be secured to surface 122 using a layer of adhesive. Underfill may be provided under dielectric substrate 70 and phased antenna array 54 if desired. In the example of FIG. 11, a dielectric over-mold structure such as over-mold 131 is provided on surface 124 of substrate 72. Over-mold 131 may cover RFIC 126 of FIG. 10 (e.g., RFIC 126 may be embedded within over-mold 131, thereby hiding RFIC 126 from view in FIG. 11). Over-mold 131 may serve to protect RFIC 126 from damage or contaminants, may perform heat dissipation, isolation, shielding, etc. Phased antenna array 54 may be mounted within peripheral region 66 of FIG. 5 and may convey radio-frequency signals through the front or rear face of device 10, as examples.

Figure 12:
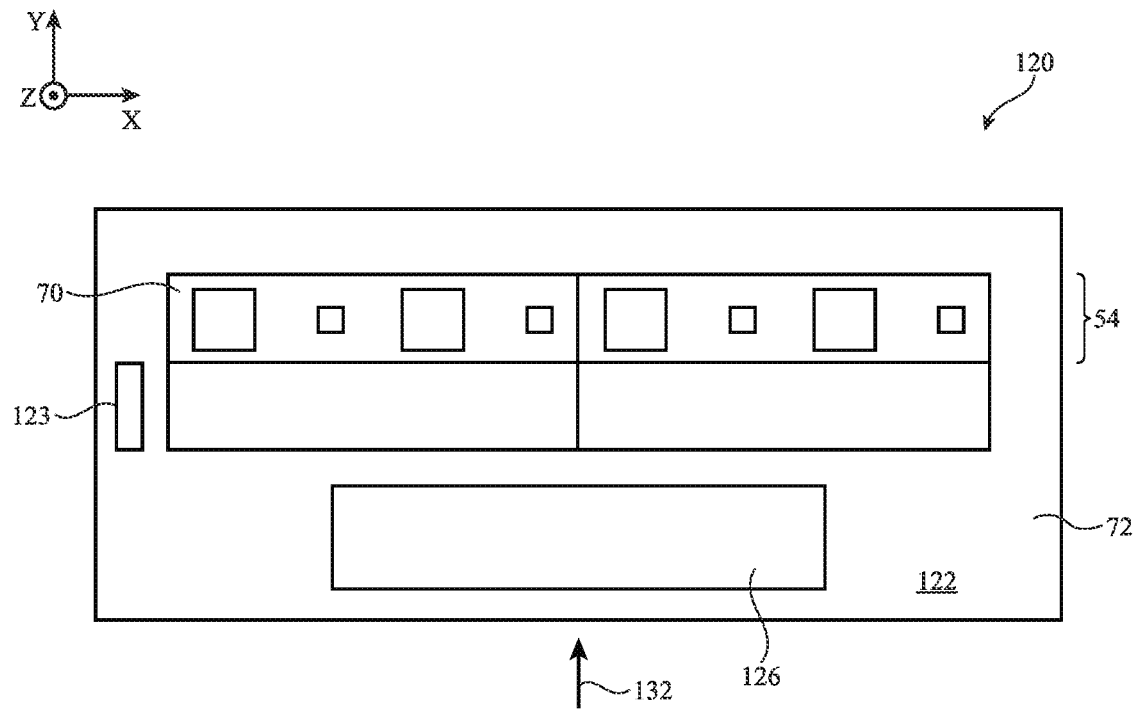
FIG. 12 is a top-down view of an illustrative antenna module having dielectric resonator antennas and a radio-frequency integrated circuit mounted to the same side of a substrate in accordance with some embodiments.

In the example of FIGS. 9-11, RFIC 126 is mounted to the opposite side of substrate 72 as phased antenna array 54. This is merely illustrative. In another suitable arrangement, RFIC 126 may be mounted to the same side of substrate 72 as phased antenna array 54. FIG. 12 is a top-down view showing how RFIC 126 may be mounted to the same side of substrate 72 as phased antenna array 54.

Figure 13:
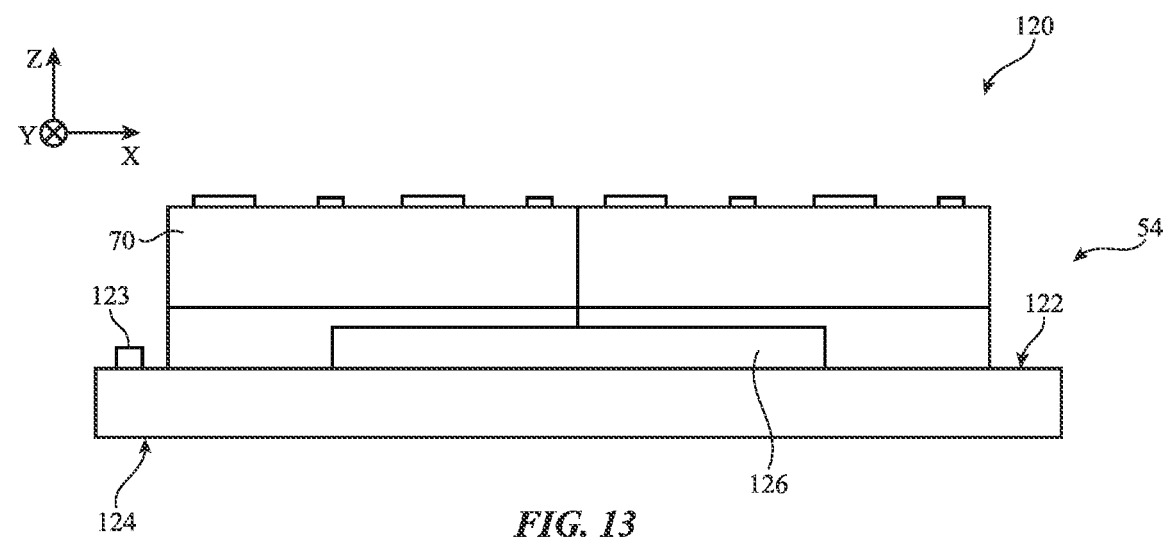
FIG. 13 is a side view of an illustrative antenna module having dielectric resonator antennas and a radio-frequency integrated circuit mounted to the same side of a substrate in accordance with some embodiments.

As shown in FIG. 12, RFIC 126 and phased antenna array 54 may both be mounted to surface 122 of substrate 72. Some or all of RFIC 126 may, for example, be laterally interposed between phased antenna array 54 and a peripheral edge of substrate 72. FIG. 13 is a side view of antenna module 120 as taken in the direction of arrow 132 of FIG. 12. As shown in FIG. 13, phased antenna array 54 may be taller in the direction of the Z-axis than RFIC 126. This may, for example, allow RFIC 126 to rest under display module 64 while phased antenna array 54 radiates through display cover layer 56 (e.g., in scenarios where antenna module 120 is mounted within peripheral region 66 of FIG. 5 and phased antenna array 54 is a front-facing phased antenna array in device 10).

Figure 14:
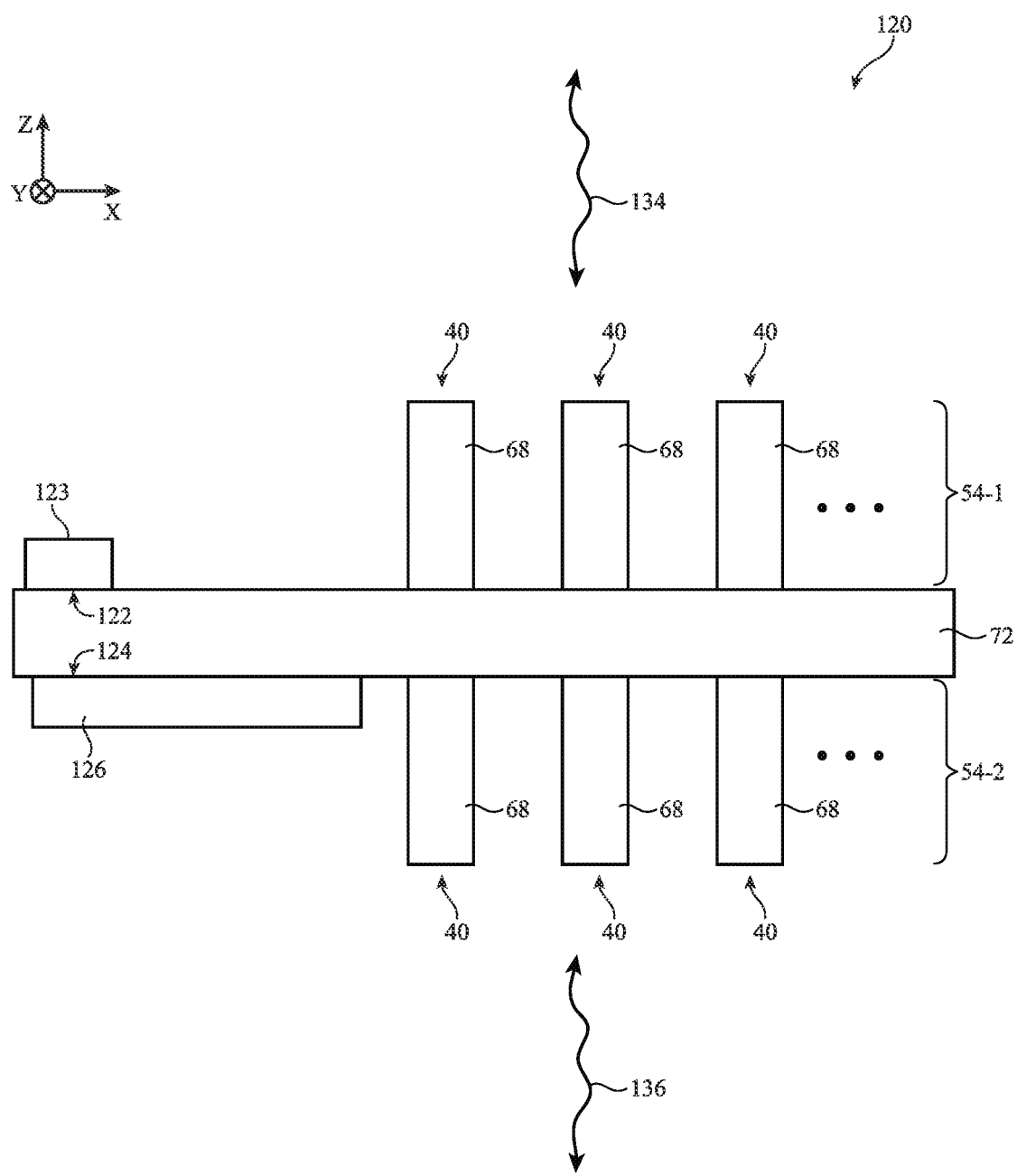
FIG. 14 is a side view of an illustrative antenna module having dielectric resonator antennas on opposing sides of a substrate in accordance with some embodiments.

If desired, antenna module 120 may include multiple phased antenna arrays mounted to different sides of substrate 72. FIG. 14 is a side view showing how multiple phased antenna arrays 54 may be mounted to different sides of substrate 72. As shown in FIG. 14, antenna module 120 may include a first phased antenna array 54-1 and a second phased antenna array 54-2. First phased antenna array 54-1 may include antennas 40 with dielectric resonating elements 68 mounted to surface 122 of substrate 72 whereas second phased antenna array 54-2 includes antennas 40 with dielectric resonating elements 68 mounted to surface 124 of substrate 72. First phased antenna array 54-1 may steer a beam of radio-frequency signals 134 across at least some of the hemisphere above surface 122. Second phased antenna array 54-2 may steer a beam of radio-frequency signals 136 across at least some of the hemisphere below surface 124. First phased antenna array 54-1 may be a one-dimensional array or a two-dimensional array of antennas 40. Second phased antenna array 54-2 may be a one-dimensional array or a two-dimensional array of antennas 40.

Antenna module 120 of FIG. 14 may, for example, be mounted within peripheral region 66 of FIG. 5. First phased antenna array 54-1 may be a front-facing phased antenna array (e.g., where radio-frequency signals 134 serve as the radio-frequency signals 62 conveyed through display cover layer 56 of FIG. 5). Second phased antenna array may be a rear-facing phased antenna array (e.g., where radio-frequency signals 136 serve as the radio-frequency signals 60 conveyed through rear housing wall 12R of FIG. 5). In another suitable arrangement, first phased antenna array 54-1 may be a rear-facing phased antenna array whereas second phased antenna array 54-2 is a front-facing phased antenna array.

As shown in FIG. 14, connector 123 may be mounted to surface 122. This is merely illustrative and, in another suitable arrangement, connector 123 may be mounted to surface 124. RFIC 126 may be mounted to surface 124. This is merely illustrative and, in another suitable arrangement, RFIC 126 may be mounted to surface 122. RFIC 126 and connector 123 may be mounted to the same surface if desired. Radio-frequency transmission lines in substrate 72 may couple RFIC 126 to each of the antennas 40 in phased antenna arrays 54-1 and 54-2. An over-mold structure may be provided over RFIC 126 and surface 124 if desired. In the example of FIG. 14, phased antenna arrays 54-1 and 54-2 are shown without a corresponding dielectric substrate 70 (FIGS. 6 and 9-13) for the sake of clarity. If desired, dielectric substrates 70 may be molded over first phased antenna array 54-1 and/or second phased antenna array 54-2.

The example of FIG. 14 in which both phased antenna arrays 54-1 and 54-2 are formed from dielectric resonator antennas is merely illustrative. In another suitable arrangement, the antennas in first phased antenna array 54-1 may be stacked patch antennas, as shown in the cross-sectional side view of FIG. 15.

Figure 15:
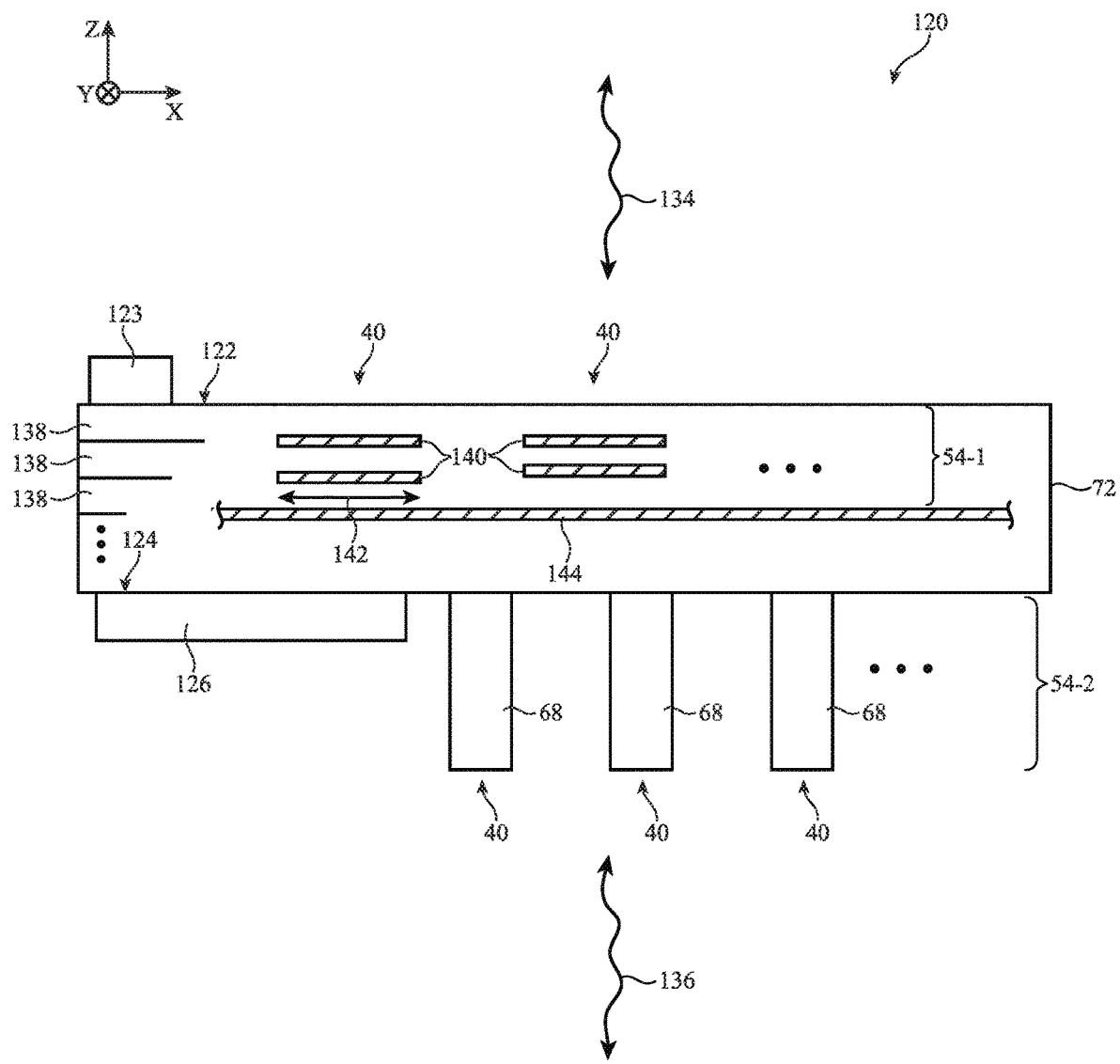
FIG. 15 is a cross-sectional side view of an illustrative antenna module having patch antennas and dielectric resonator antennas at opposing sides of a substrate in accordance with some embodiments.

As shown in FIG. 15, the antennas 40 in first phased antenna array 54-1 may be stacked patch antennas. Each antenna 40 in first phased antenna array 54-1 may include one or more conductive patches 140 embedded within the dielectric layers 138 of substrate 72. Conductive patches 140 may be spaced apart from and extend parallel to ground traces 144 in substrate 72. The conductive patches 140 in antennas 40 may include directly-fed patch antenna resonating elements and/or indirectly-fed parasitic antenna resonating elements that at least partially overlap at least one directly-fed patch antenna resonating element. Conductive patches 140 may have lengths 142 that determine the frequency response of first phased antenna array 54-1. Lengths 142 may, for example, be approximately equal to one-half the effective wavelength corresponding to a frequency in the frequency band of operation of first phased antenna array 54-1.

In practice, the dielectric resonating elements 68 in second phased antenna array 54-2 may occupy greater height (e.g., in the direction of the Z-axis) than conductive patches 140 in first phased antenna array 54-1. At the same time, conductive patches 140 may occupy greater area (e.g., in the X-Y plane) than dielectric resonating elements 68. This may allow antenna module 120 to be mounted within device 10 at locations where there may be more space to place antennas for radiating through one side of device 10 than the other. As an example, antenna module 120 of FIG. 15 may be mounted within peripheral region 66 of FIG. 5 with second phased antenna array 54-2 facing display cover layer 56 and first phased antenna array 54-1 facing rear housing wall 12R (e.g., there may be more space to place antennas for radiating through rear housing wall 12R than through display cover layer 56 due to the presence of display module 64). The example of FIG. 15 is merely illustrative and, in another suitable arrangement, first phased antenna array 54-1 may include dielectric resonator antennas whereas second phased antenna array 54-2 is includes stacked patch antennas.

In practice, it can be challenging to manufacture antenna modules having dielectric resonator antennas such as antenna module 120 of FIGS. 9-15. In some scenarios, antenna modules are manufactured by individually forming each dielectric resonating element (e.g., by sintering a ceramic powder), individually metallizing the probe feed for each dielectric resonating element, injection molding the dielectric substrate over each individually-formed dielectric resonating element in the array, grinding down the portion of the dielectric resonating elements protruding beyond the dielectric substrate, and surface-mounting the result to a board. This process can be very complicated, time consuming, and expensive, and can lead to antenna modules that exhibit a substantial amount of mechanical variation that limits the overall mechanical and/or wireless performance of the module (e.g., due to poor dielectric resonating element parallelism, height coplanarity, and dimension, contact pad tolerance issues, and unpredictable dielectric resonating element tilting). In order to mitigate these issues, antenna module 120 may be manufactured using a largely scalable, IC-assembly process compatible, double side molding process, as shown in FIGS. 16 and 17.

Figure 16:
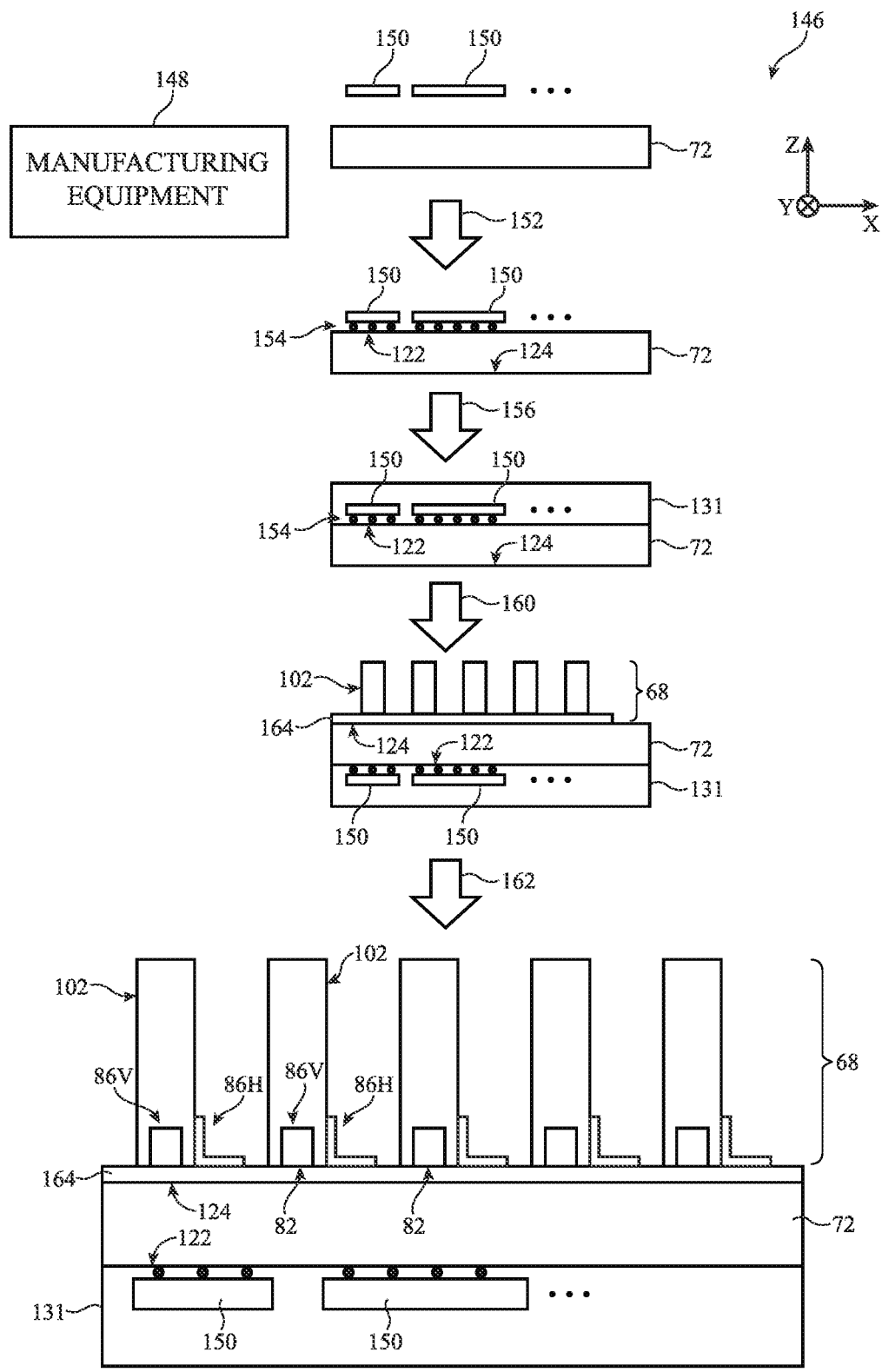
FIGS. 16 and 17 are diagrams of an illustrative assembly process for an antenna module having dielectric resonator antennas mounted to a substrate in accordance with some embodiments.
Figure 17:
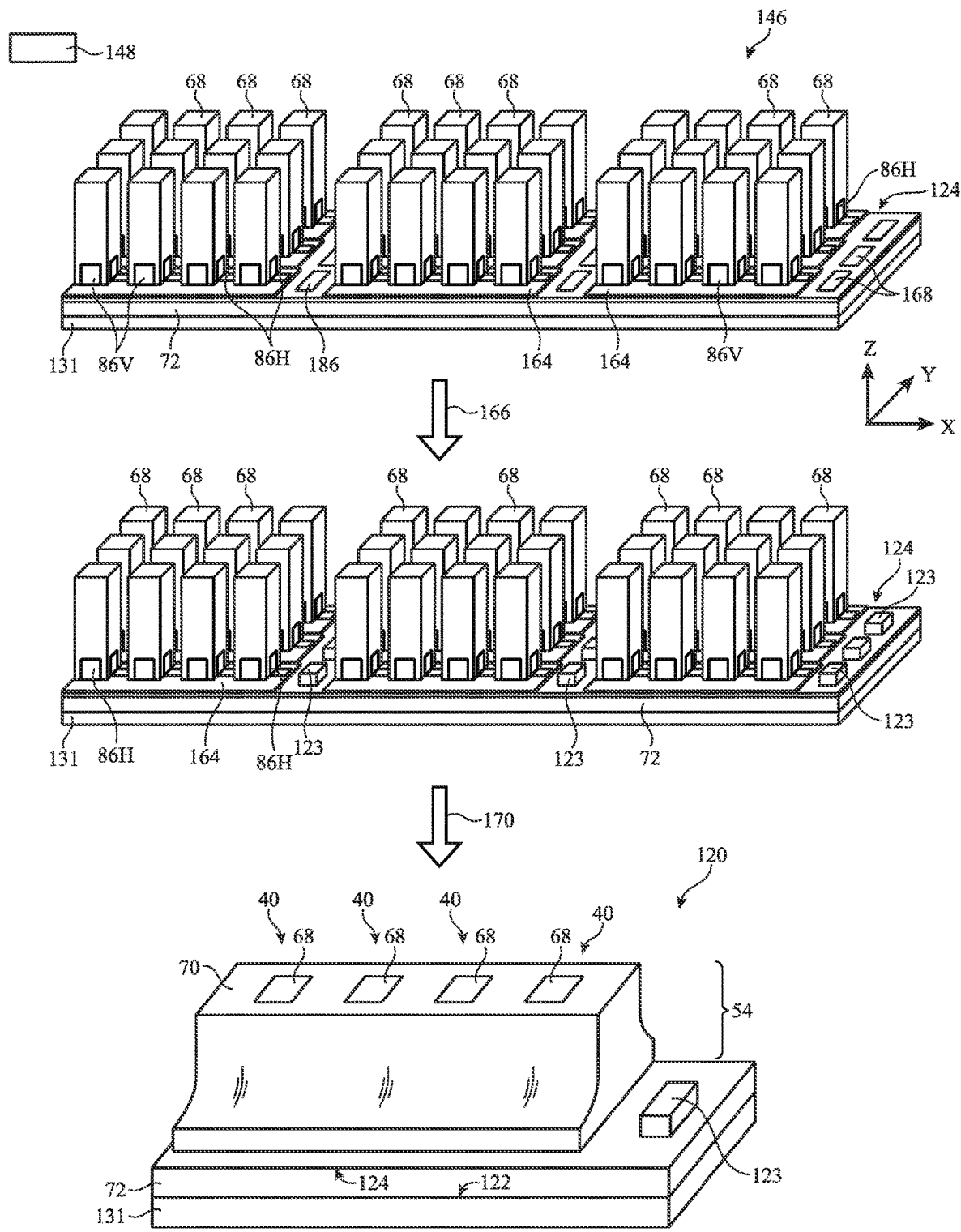

FIGS. 16 and 17 are diagrams of an illustrative assembly process for antenna module 120. As shown in FIG. 16, antenna modules 120 may be manufactured in a manufacturing system such as manufacturing system 146. Manufacturing system 146 may include manufacturing equipment 148. Manufacturing system 146 may gather substrate 72 and electronic components 150 to be assembled into a given antenna module 120. Substrate 72 may include radio-frequency transmission line structures (e.g., signal and ground traces on or embedded within the dielectric layers of substrate 72) and corresponding contact pads coupled to the radio-frequency transmission line structures at the surfaces of substrate 72. Electronic components 150 may include RFIC 126 (FIG. 9-15) or any other desired radio-frequency components (e.g., radio-frequency switching circuits, filter circuits, discrete capacitors, resistors, and inductors, amplifier circuits, etc.).

Manufacturing equipment 148 may surface mount electronic components 150 to surface 122 of substrate 72, as shown by arrow 152 (e.g., using surface-mount technology (SMT) equipment in manufacturing equipment 148). For example, solder balls 154 or any other desired conductive interconnect structures may be used to couple the terminals (ports) of electronic components 150 to corresponding contact pads on surface 122 of substrate 72. Manufacturing equipment 148 may then layer over-mold 131 over the surface-mounted components 150 and surface 122 of substrate 72, as shown by arrow 156. This may serve to encapsulate or embed electronic components 150 at surface 122 within over-mold 131.

Manufacturing equipment 148 may then flip substrate 72 over and each dielectric resonating element 68 in the antenna module may be concurrently formed on surface 124 of substrate 72. For example, manufacturing equipment 148 may form dielectric resonating elements 68 by performing a molding/selective molding process using high dielectric constant epoxy mold compound material to mold each of the dielectric resonating elements 68 in the module at once (e.g., so that dielectric resonating elements 68 exhibit dielectric constant dk1 of FIG. 6). This process may also form a top-most layer 164 on surface 124 of substrate 72. Top-most layer 164 may cover the contact pads at surface 124 for the radio-frequency transmission lines used to feed dielectric resonating elements 68 (e.g., radio-frequency transmission lines 88V and 88H of FIG. 6). While top-most layer 164 may be formed from the same material as dielectric resonating elements 68, top-most layer 164 may sometimes be referred to herein as forming a part of substrate 72 or forming the top-most layer of substrate 72.

Manufacturing equipment 148 may then perform laser activation and metallization for dielectric resonating elements 68 (e.g., using a laser direct structuring (LDS) process), as shown by arrow 162. For example, lasers in manufacturing equipment 148 may be used to create a pattern or seed layer for the metallization of the feed probes and optionally the parasitic elements for antennas 40 (e.g., on sidewalls 102 of dielectric resonating elements 68 and/or on top-layer 164). Manufacturing equipment 148 may then perform a physical deposition or chemical plating process that metalizes the pattern or seed layer created by the lasers. This may serve to form conductive structures 86V and 86H on sidewalls 102 of dielectric resonating elements 68 (e.g., at bottom surface 82 of dielectric resonating elements 68) and/or on top-most layer 164. If desired, this process may also be used to form parasitic elements 108H and 108V (FIG. 7) and/or parasitic elements 114-1 and 114-2 (FIG. 8) on sidewalls 102 and/or top-most layer 164. In scenarios where dielectric resonating elements 68 only cover a single polarization, manufacturing equipment 148 may form only a single feed probe on each dielectric resonating element 68.

In addition, manufacturing equipment 148 may couple conductive structures 86V and 86H to corresponding contact pads on surface 124 of substrate 72 (e.g., by forming conductive vias that extend through top-most layer 164). In scenarios where parasitic elements 114-1 and/or 114-2 of FIG. 8 are formed, manufacturing equipment 148 may form conductive vias through top-most layer 164 to couple the parasitic elements to ground traces at surface 124. Coupling conductive structures 86V and 86H to the contact pads on surface 124 may serve to couple conductive structures 86V and 86H to corresponding radio-frequency transmission lines in substrate 72. The radio-frequency transmission lines may couple conductive structures 86V and 86H to electronic components 150 at surface 122.

If desired, multiple antenna modules 120 may be manufactured from the same substrate 72, as shown in the perspective view of FIG. 17. As shown in FIG. 17, substrate 72 may be used to form nine antenna modules each having four antennas and thus four dielectric resonating elements 68 arranged in a 1×4 pattern. This example is merely illustrative and, in general, any desired number of antenna modules may be formed from the same substrate 72. The processes of FIG. 16 may be performed concurrently for each of the antenna modules formed from substrate 72. Concurrently manufacturing multiple antenna modules in this way may increase the reliability of the antenna modules (both within each antenna module and between antenna modules) and reduce the cost and time required to manufacture multiple devices 10. This process may allow antenna module 120 to exhibit a smaller form factor for multiple applications, may eliminate extra injection molding, sintering, surface-mounting, and underfilling relative to arrangements where each dielectric resonating element is individually molded and then mounted to a substrate. This arrangement may also allow for tighter process control and improved yield relative to arrangements where each dielectric resonating element is individually molded and then mounted to a substrate.

As by arrow 166, manufacturing equipment 148 may surface-mount connectors 123 to connector contact pads 168 at surface 124 of substrate 72. Connectors 123 may couple electronic components 150 in over-mold 131 to transceiver circuitry on a separate substrate after the antenna modules are assembled into device 10, for example. Cutting equipment (e.g., blade or laser cutting tools) in manufacturing equipment 148 may then dice (cut) substrate 72 into separate antenna modules, as shown by arrow 170. In the example of FIG. 17, this may produce nine separate strips of substrate 72 that form nine separate antenna modules 120, each having four antennas 40 with corresponding dielectric resonating elements 68. Dielectric structure 70 may be molded over dielectric resonating elements 68 after dicing, at any other desired time after conductive structures 86H and 86V have been formed on dielectric resonating elements 68, or may be omitted if desired.

Figure 18:
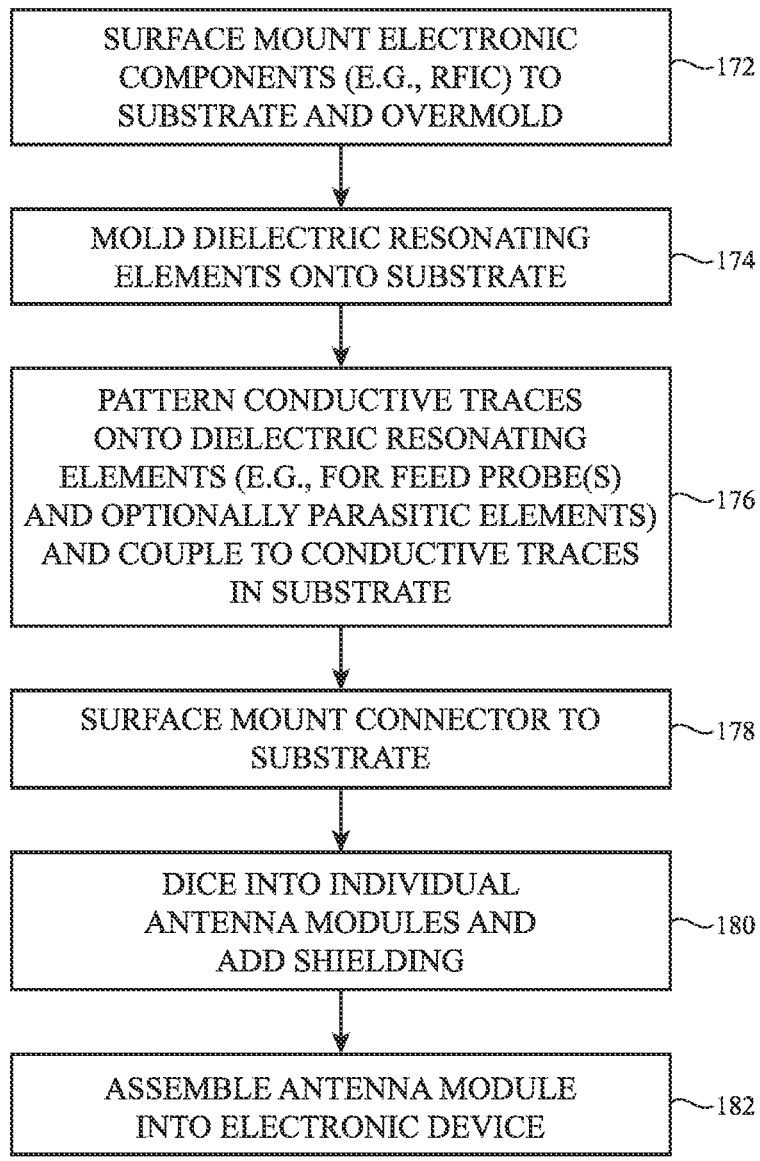
FIG. 18 is a flow chart of illustrative steps that may be performed in assembling an antenna module having dielectric resonator antennas mounted to a substrate in accordance with some embodiments.

FIG. 18 is a flow chart of illustrative steps that may be performed by manufacturing equipment 148 of FIGS. 16 and 17 in manufacturing antenna module 120. At step 172, manufacturing equipment 148 may surface-mount electronic components 150 (e.g., one or more radio-frequency integrated circuits) to a surface of substrate 72 (e.g., as shown by arrow 152 of FIG. 16). Manufacturing equipment 148 may layer over-mold 131 over the surface-mounted electronic components 150 (e.g., as shown by arrow 156 of FIG. 16).

At step 174, manufacturing equipment 148 may mold dielectric resonating elements 68 on a surface of substrate 72 (e.g., as shown by arrow 160 of FIG. 16). Dielectric resonating elements 68 may be molded onto the surface of substrate 72 opposite to the surface-mounted electronic components 150. This is merely illustrative and, if desired, dielectric resonating elements 68 may be molded onto the same surface of substrate 72 as the surface-mounted electronic components 150 (e.g., as shown in FIGS. 12 and 13).

At step 176, manufacturing equipment 148 pattern conductive traces onto dielectric resonating elements 68 (e.g., as shown by arrow 162 of FIG. 16). Manufacturing equipment 148 may, for example, use lasers to activate or create a seed layer on dielectric resonating elements 68. Manufacturing equipment 148 may then deposit conductive material over the activated portions of dielectric resonating elements 68. The conductive material may form conductive structures 86V and 86H (e.g., for feed probes 100V and 100H of FIG. 6) and/or parasitic elements for the antennas.

At step 178, manufacturing equipment 148 may surface-mount connectors 123 onto the connector contact pads 168 of substrate 72 (e.g., as shown by arrow 166 of FIG. 17).

At step 180, manufacturing equipment 148 may dice substrate 180 into individual antenna modules 120 and may add corresponding shielding structures to the antenna modules (e.g., as shown by arrow 170 of FIG. 17). The shielding may serve to isolate electronic components 150 from electromagnetic interference, for example.

At step 182, manufacturing equipment 148 may assemble a manufactured antenna module 120 into device 10. For example, manufacturing equipment 148 may mount antenna module 120 within peripheral region 66 of FIG. 5 or elsewhere within the interior of device 10. Antenna module 120 may be mounted to convey radio-frequency signals through display cover layer 56 or rear housing wall 12R of FIG. 5, for example. The steps of FIG. 18 are merely illustrative and, if desired, other processes may be used to manufacture antenna module 120.

In practice, implementation of dielectric resonator antennas in electronic devices can be challenging since the dielectric resonator antennas have high aspect ratios that make it difficult to control system alignment, reliability, and interconnect reliability. In other phased antenna arrays, each antenna may require two radio-frequency connectors to feed, which can be undesirably bulky. Integrating the dielectric resonator antennas into antenna module 120 may allow the antennas to each be fed without requiring as many connectors and may allow the antennas to be properly aligned with a high degree of reliability.

In practice, the metallization used to feed dielectric resonating elements 68 can be costly to perform at scale. In another suitable arrangement, the feed probes for dielectric resonating elements 68 may be pressed against dielectric resonating elements 68 using feed probe biasing structures.

This may allow the antennas to be fed without additional metallizations on the ceramic, which may decrease cost and design complexity.

Figure 19:
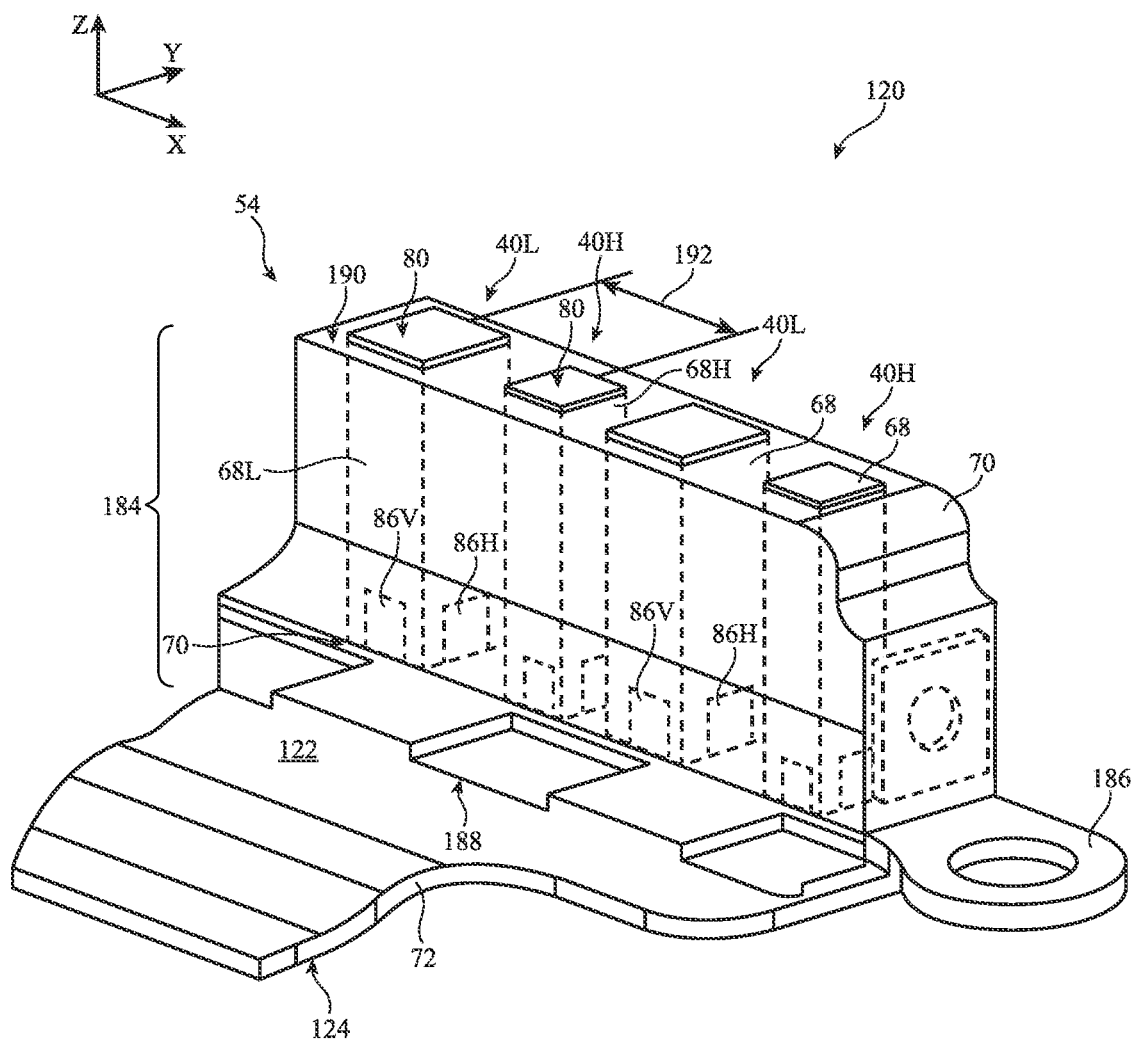
FIG. 19 is a perspective view of an illustrative antenna module having dielectric resonator antennas with feed probes that are biased towards dielectric resonating elements by biasing structures in accordance with some embodiments.

FIG. 19 is a perspective view of an illustrative antenna module 120 having feed probes that are pressed against dielectric resonating elements 68 using feed probe biasing structures. In the example of FIG. 19, substrate 72 is a flexible printed circuit. Phased antenna array 54 may include dielectric resonating elements 68 embedded within dielectric substrate 70 to form antenna package 184. Antenna package 184 may then be surface-mounted to contact pads on surface 122 of substrate 72. In the example of FIG. 19, phased antenna array 54 includes two low band antennas 40L interleaved with two high band antennas 40H (e.g., in a 1×4 array). This is merely illustrative and, in general, phased antenna array 54 may include any desired number of antennas for covering any desired frequency bands. The antennas may be arranged in any desired pattern.

As shown in FIG. 19, the dielectric resonating element 68H in high band antennas 40H may be separated from the dielectric resonating element 68L in one or two adjacent low band antennas 40L by distance 192. Distance 192 may be selected to provide satisfactory electromagnetic isolation between low band antennas 40L and high band antennas 40H. Each dielectric resonating element in phased antenna array 54 may be fed by feed probes having conductive structures 86V and 86H. Conductive structures 86V and 86H may be pressed against dielectric resonating elements 68 by feed probe biasing structures in antenna package 184 (not shown in FIG. 19 for the sake of clarity). The feed probe biasing structures may, for example, press or bias conductive structure 86H against the sidewalls 102 of dielectric resonating elements 68 (e.g., by exerting a biasing force in the −X direction). Similarly, the feed probe biasing structures may press or bias conductive structure 86V against the sidewalls 102 of dielectric resonating elements 68 (e.g., by exerting a biasing force in the +Y direction).

Dielectric substrate 70 may be molded over the feed probe biasing structures as well as dielectric resonating elements 68. Dielectric substrate 70 may have a bottom surface 188 at substrate 72 and an opposing top surface 190. In the example of FIG. 19, the top surface 80 of dielectric resonating elements 68 protrudes above top surface 190 of dielectric substrate 70. This is merely illustrative and, if desired, top surface 190 may lie flush with the top surface 80. In another suitable arrangement, dielectric substrate 70 may cover the top surface 80 of dielectric resonating elements 70. An attachment structure 186 may be partially embedded within dielectric substrate 70 (e.g., dielectric substrate 70 may be molded over part of attachment structure 186). Attachment structure 186 may help to secure antenna module 120 in place within device 10 if desired (e.g., using screws, pins, or other structures that extend through an opening in attachment structure 186).

Figure 20:
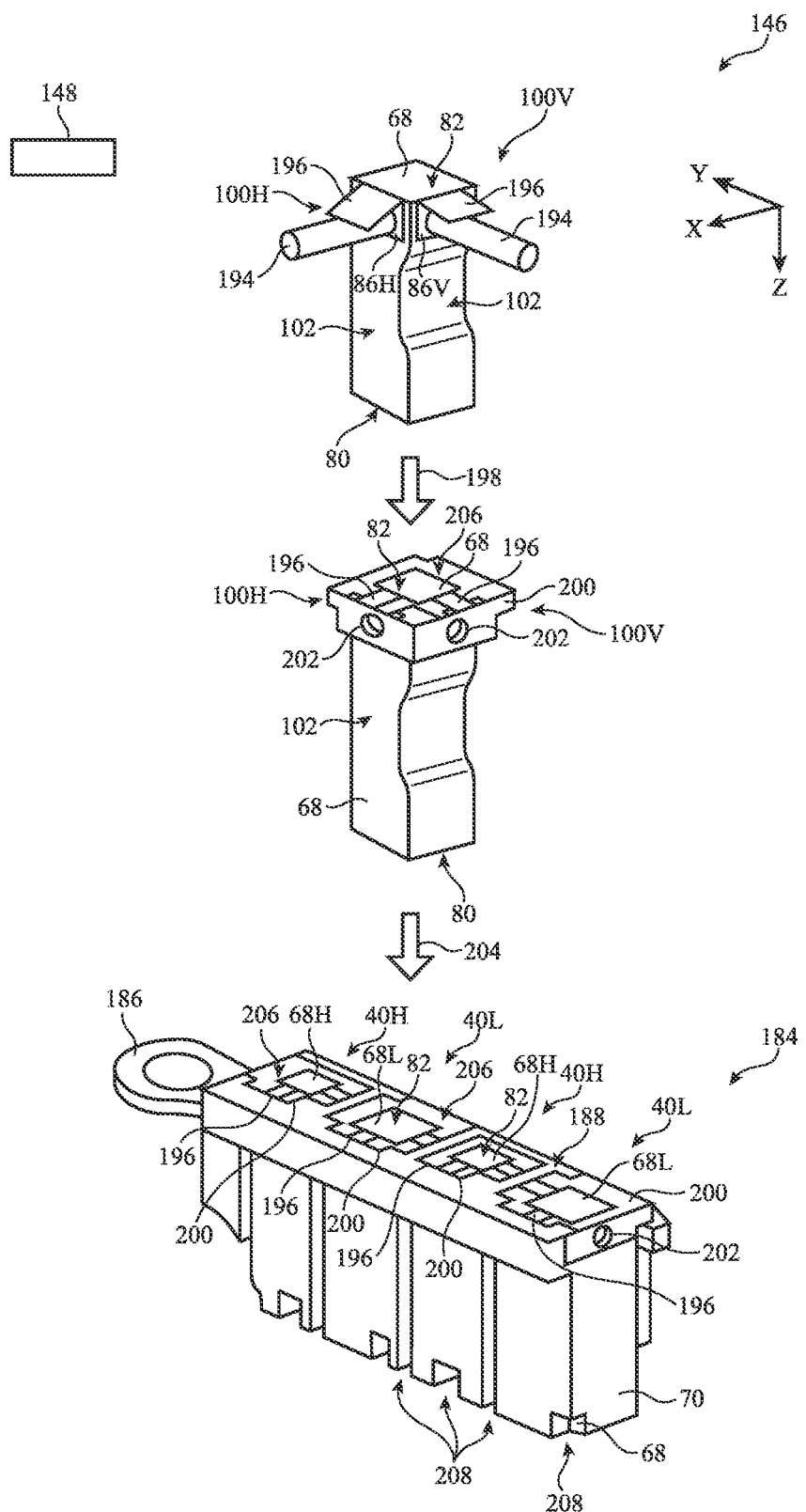
FIG. 20 is a diagram showing how an illustrative antenna module of the type shown in FIG. 19 may be assembled in accordance with some embodiments.

FIG. 20 is diagram of an illustrative assembly process for antenna module 120 of FIG. 19. As shown in FIG. 20, the antenna modules may be manufactured in manufacturing system 146. Manufacturing equipment 148 may include alignment posts 194. Alignment posts 194 may press conductive structure 86H against a first sidewall 102 of dielectric resonating element 68 and may press conductive structure 86V against a second (orthogonal) sidewall 102 of dielectric resonating element 68. Conductive structures 86H and 86V may include stub portions 196 that lie in the X-Y plane. Conductive structures 86H and 86V may, for example, be stamped from pieces of sheet metal (e.g., while alignment posts press against conductive structures 86H and 86V, leaving behind stub portions 196).

This may allow for a tight control of the size and position of the stamped conductive structures 86H and 86L while minimizing gaps between the conductive structures and dielectric resonating element 68.

During a first molding process (e.g., a first injection molding process), manufacturing equipment 148 may mold a feed probe biasing structure such as biasing structure 200 (sometimes referred to herein as retention structure 200) over sidewalls 102 and conductive structures 86H and 86V at bottom surface 82 of dielectric resonating element 68 (e.g., as shown by arrow 198). Alignment posts 194 may hold conductive structures 86H and 86V in place during the first molding process and may be removed once biasing structure 200 has been formed (e.g., leaving behind alignment post holes 202 in biasing structure 200). Once the alignment posts 194 have been removed, biasing structure 200 may hold conductive structures 86V and 86H in place against the sidewalls 102 of dielectric resonating element 68. Biasing structure 200 may, for example, exert a biasing force in the −X direction against conductive structure 86H and may exert a biasing force in the +Y direction against conductive structure 86V. Stub portions 196 of conductive structures 86H and 86V may remain exposed after molding biasing structure 200 onto dielectric resonating element 68. This may allow stub portions 196 to be coupled to corresponding contact pads at surface 122 of substrate 72 of FIG. 19 (e.g., using solder, conductive adhesive, etc.), thereby forming the feed probes for antenna module 120. Biasing structure 200 may have a bottom surface 206. Bottom surface 206 may lie flush with bottom surface 82 of dielectric resonating element 68.

This process may be performed for each antenna in antenna module 120. Dielectric substrate 70 may subsequently be molded over each of the dielectric resonating elements 68, the corresponding biasing structures 200, and attachment structure 186 (e.g., using a second injection molding process) to form antenna package 184, as shown by arrow 204. For example, a tool in manufacturing equipment 148 may locate the over-molded dielectric substrate 70 by the plastic in biasing structures 200 to maintain the contact positions of conductive structures 86H and 86V. Dielectric substrate 70 may include one or more openings 208 (e.g., at locations where the tool in manufacturing equipment 148 held the dielectric resonating elements during over-molding). A spring feature on the tool may locate the top surface 80 of dielectric resonating elements 68 to prevent shifting during molding, thereby maintaining reliable coplanarity for the bottom surface 82 across each dielectric resonating element 68 in antenna package 184 (e.g., bottom surface 206 of biasing structures 200 may be coplanar with bottom surface 82 of dielectric resonating elements 68L and 68H, stub portions 196 of conductive structures 86H and 86V, and bottom surface 188 of dielectric substrate 70 across antenna package 184 with a very tight tolerance). This uniform and reliable coplanarity may allow the bottom surface of antenna package 184 to be surface-mounted to substrate 72 (thereby forming antenna module 120) with minimal or uniform gaps across antenna package 184, thereby optimizing the mechanical reliability and wireless performance of antenna module 120. Antenna module 120 may then be mounted within device 10.

Figure 21:
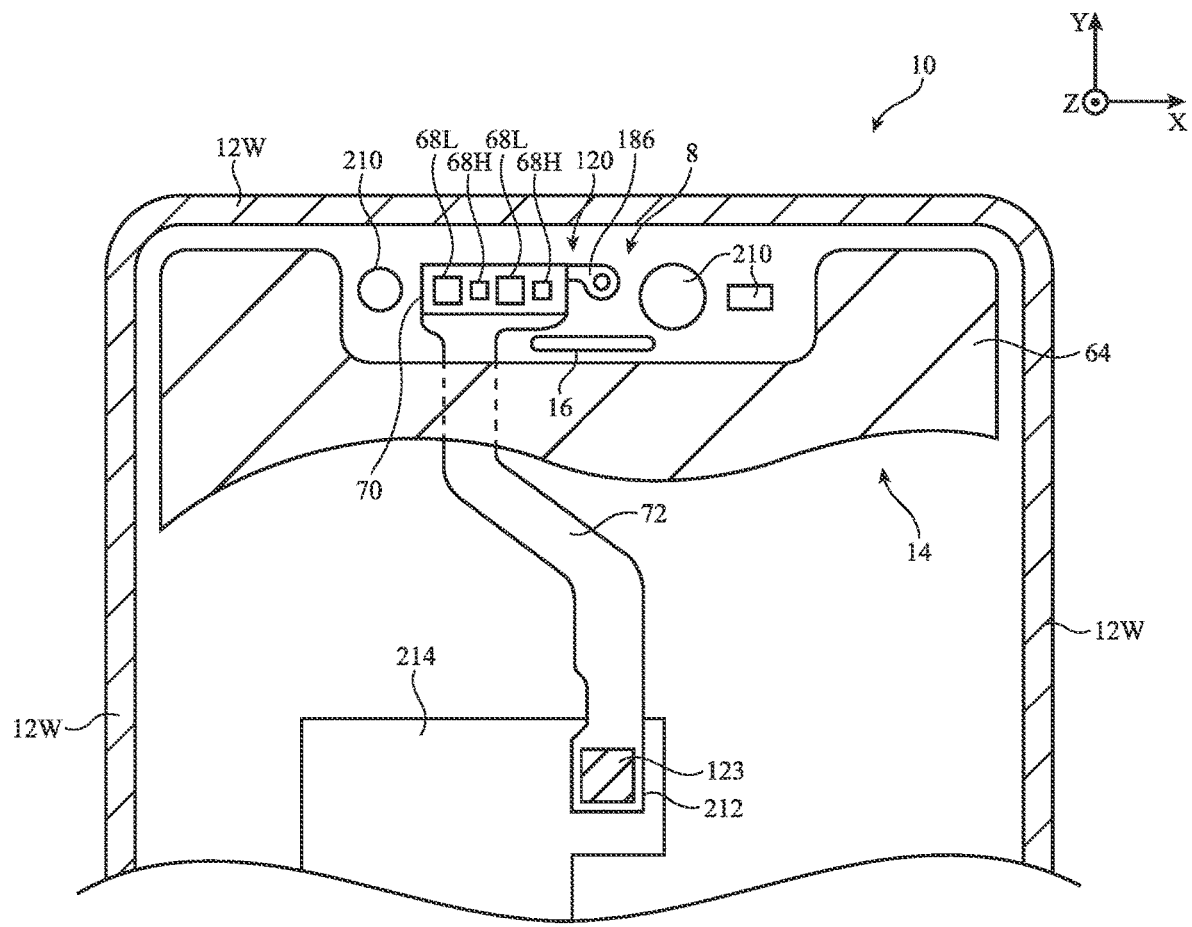
FIG. 21 is a top-down view of an illustrative electronic device having an antenna module aligned with a notch in a display module in accordance with some embodiments.

FIG. 21 is a top-down view showing one illustrative location where antenna module 120 may be mounted within device 10 (e.g., antenna module 120 of FIG. 19 or other antenna modules 120 as described herein). As shown in FIG.

21, display module 64 in display 14 may include notch 8. Display cover layer 56 of FIG. 5 has been omitted from FIG. 21 for the sake of clarity. Display module 64 may form active area AA of display 14 whereas notch 8 forms part of inactive area IA of display 14 (FIG. 1). The edges of notch 8 may be defined by peripheral conductive housing structures 12W and display module 64. For example, notch 8 may have two or more edges (e.g., three edges) defined by display module 64 and one or more edges defined by peripheral conductive housing structures 12W.

Device 10 may include speaker port 16 (e.g., an ear speaker) within notch 8. If desired, device 10 may include other components 210 within notch 8. Other components 210 may include one or more image sensors such as one or more cameras, an infrared image sensor, an infrared light emitter (e.g., an infrared dot projector and/or flood illuminator), an ambient light sensor, a fingerprint sensor, a capacitive proximity sensor, a thermal sensor, a moisture sensor, or any other desired input/output components (e.g., input/output devices 26 of FIG. 2). Antenna module 120 (e.g., an antenna module having dielectric resonating elements 68L interleaved with dielectric resonating elements 68H for covering different frequency bands) may be mounted within device 10 (e.g., within peripheral region 66 of FIG. 5) and aligned with the portion(s) of notch 8 that are not occupied by other components 210 or speaker port 16. Antenna module 120 may be laterally interposed between two components 210 such as between an image sensor (e.g., a rear-facing camera) and an ambient light sensor, dot projector, flood illuminator, or ambient light sensor, for example.

Substrate 72 may extend under display module 64 to another substrate such as substrate 214 (e.g., another flexible printed circuit, a rigid printed circuit board, a main logic board, etc.). The radio-frequency transceiver circuitry for antenna module 120 may be mounted to substrate 214 if desired. Connector 123 on substrate 72 may be coupled to connector 212 (e.g., a board-to-board connector) on substrate 214. This may allow the antennas in antenna module 120 to cover at least some of the hemisphere over the front face of device 10 without occupying an excessive amount of space within device 10, for example. The example of FIG. 21 is merely illustrative and, in general, antenna module 120 may be mounted at any desired location within device 10. Antenna module 120 may have any desired number of antennas for covering any desired frequency bands. The antennas in antenna module 120 may be arranged in any desired one or two-dimensional pattern.

Figure 22:
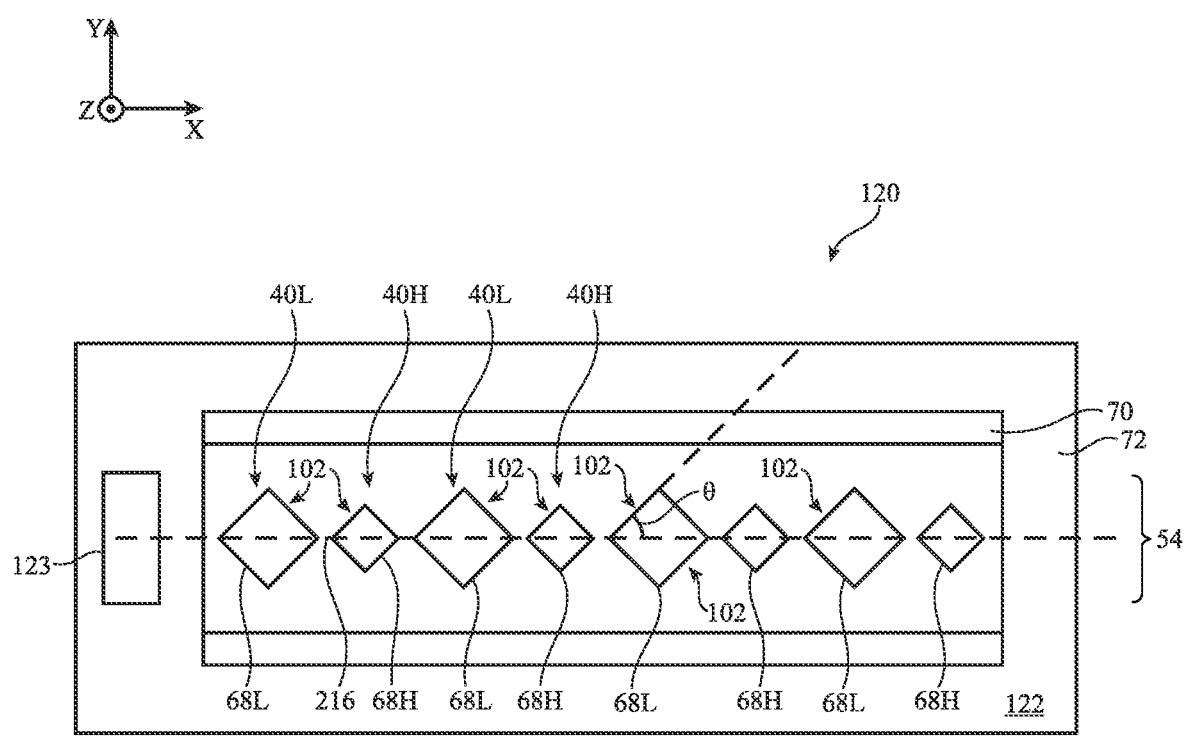
FIG. 22 is a top-down view of an illustrative antenna module having rotated dielectric resonating elements in accordance with some embodiments.

In order to further increase isolation between adjacent antennas 40 in phased antenna array 54, each dielectric antenna resonating element in the array may be rotated relative to as shown in FIGS. 9-21. FIG. 22 is a top view showing how phased antenna array 54 may include rotated dielectric antenna resonating elements.

As shown in FIG. 22, antenna module 120 may include dielectric resonating elements 68H and 68L that are arranged in a one-dimensional pattern along longitudinal axis 216 (e.g., an axis running through the central/longitudinal axis of each of the dielectric resonating elements). Dielectric substrate 70 may be molded over dielectric resonating elements 68H and 68L. Prior to mounting to substrate 72, dielectric resonating elements 68H and 68L may be rotated so that the sidewalls of the dielectric resonating elements (e.g., the lateral/peripheral edges of the dielectric resonating elements as viewed from above) are each oriented at a non-parallel angle with respect to longitudinal axis 216. For example, each dielectric resonating element 68H and 68L may include a first pair of opposing sidewalls 102 that are oriented at angle θ with respect to longitudinal axis 216. Each dielectric resonating element 68H and 68L may also include a second pair of opposing sidewalk 102 that are oriented perpendicular to the first pair of opposing sidewalk (e.g., at a 90 degree angle with respect to the first pair of opposing sidewalls or an angle of angle θ+90 degrees with respect to longitudinal axis 216). In this way, the sidewalks may also be oriented at a non-parallel angle with respect to each lateral edge of substrate 72, if desired. Angle θ may be between 0 degrees and 90 degrees (e.g., 45 degrees, 30-60 degrees, 40-50 degrees, etc.). Orienting dielectric resonating elements 68L and 68H in this way may serve to minimize cross-coupling between adjacent antennas 40L and 40H, thereby maximizing isolation between the antennas and thus the radio-frequency performance of antenna module 120.

In the example of FIG. 22, phased antenna array 54 includes four low band antennas 40L interleaved with four high band antennas 40H. This example is merely illustrative. In general, phased antenna array 54 may include any desired number of antennas for covering any desired bands and arranged in any desired one or two-dimensional pattern on surface 122 of substrate 72. Connector 123 may be mounted to surface 122 or the opposing surface of substrate 72.

Figure 23:
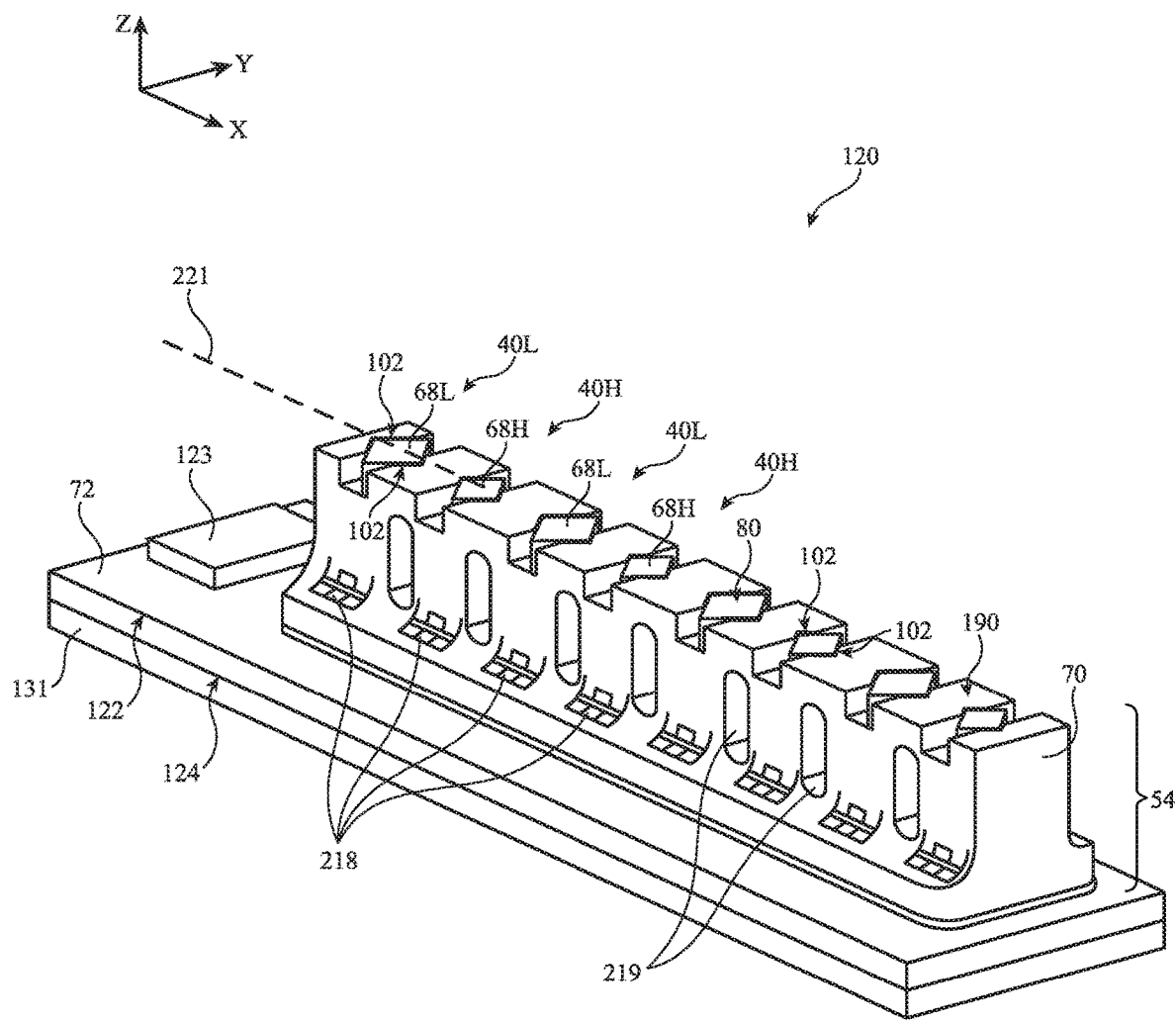
FIG. 23 is a perspective view of an illustrative antenna module having rotated dielectric resonating elements in accordance with some embodiments.

FIG. 23 is a perspective view of the antenna module 120 of FIG. 22. In the example of FIGS. 22 and 23, the RFIC for antenna module 120 is mounted to surface 124 of substrate 72 and over-mold 131 is layered under surface 124 and the RFIC. This is merely illustrative and, in another suitable arrangement, the RFIC may be mounted to surface 122 (e.g., as shown in FIGS. 12 and 13).

As shown in FIG. 23, feed probe biasing structures such as biasing structures 218 may press the feed probes for phased antenna array 54 against dielectric resonating elements 68L and 68H (e.g., by exerting biasing forces against the conductive structures in the feed probes that are oriented normal to the sidewalls 102 against which the feed probes are pressed). Dielectric substrate 70 may be molded over dielectric resonating elements 68L and 68H and biasing structures 218 (e.g., to form a single integrated antenna package that is then surface-mounted to substrate 72). Dielectric substrate 70 may, if desired, include openings that expose biasing structures 218. Dielectric substrate 70 may also include openings (holes) 219 that are laterally interposed between each pair of adjacent dielectric resonating elements in phased antenna array 54. Openings 219 may, for example, serve to further increase isolation between the antennas 40L and 40H in phased antenna array 54.

Figure 24:
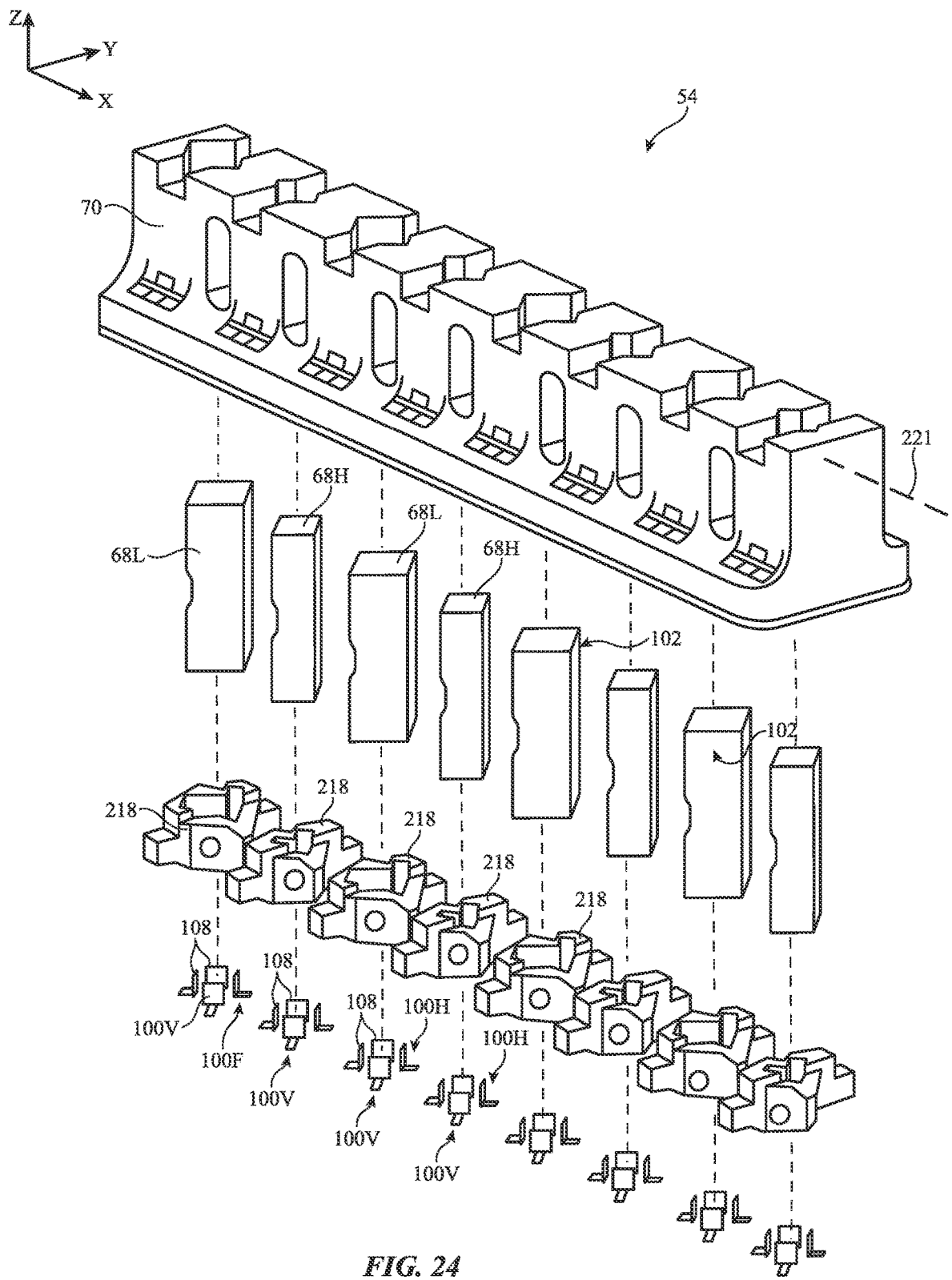
FIG. 24 is an exploded perspective view of an illustrative antenna module of the type shown in FIGS. 22 and 23 in accordance with some embodiments.

FIG. 24 is an exploded view of the antenna module 120 of FIGS. 22 and 23. As shown in FIG. 24, feed probes 100V and 100H and optionally parasitic elements 108 may be pressed against dielectric resonating elements 68L and 68H by biasing structures 218. In scenarios where dielectric resonating elements 68L and 68H are fed by only a single feed probe, parasitic elements 108 may be omitted and/or parasitic elements 114-1 and 114-2 of FIG. 8 may be used.

Biasing structure 218 may be molded over dielectric resonating elements 68L and 68H, feed probes 100H and 100V, and parasitic elements 108 during a first molding process (e.g., similar to the first molding process associated with arrow 198 of FIG. 20). Alignment posts may press feed probes 100H and 100V and parasitic elements 108 against the dielectric resonating elements during the first molding process and may leave behind alignment post openings in biasing structures 218 after molding. Biasing structures 218 may press feed probes 100H and 100V and parasitic elements 108 against dielectric resonating elements 68L and

68H to maintain a reliable coupling between the feed probes, parasitic elements, and the dielectric resonating elements. Dielectric substrate 70 may be molded over all of the dielectric resonating elements 68H and 68L and biasing structures 218 in a second molding process (e.g., similar to the second molding process associated with arrow 204 of FIG. 20). The assembled phased antenna array 54 may subsequently be surface-mounted to substrate 72 of FIGS. 22 and 23 to form antenna module 120.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:
a printed circuit board;
a phased antenna array having dielectric resonating elements mounted to a surface of the printed circuit board;
feed probes coupled to the dielectric resonating elements and configured to excite the dielectric resonating elements; and
a plastic substrate on the printed circuit board, wherein the dielectric resonating elements are embedded in the plastic substrate, the dielectric resonating elements comprise first dielectric resonating elements having a first width and second dielectric resonating elements having a second width different than the first width, and the second dielectric resonating elements are interleaved with the first dielectric resonating elements.

2. The electronic device of claim 1,
wherein the plastic substrate comprises injection-molded plastic.

3. The electronic device of claim 2,
wherein the dielectric resonating elements comprise ceramic columns.

4. The electronic device of claim 1,
wherein the plastic substrate has a first surface at the printed circuit board and a second surface opposite the first surface, the dielectric resonating elements extending from the first surface to the second surface of the plastic substrate.

5. The electronic device of claim 1,
wherein the printed circuit board comprises a flexible printed circuit having transmission lines coupled to the feed probes.

6. The electronic device of claim 1,
wherein the dielectric resonating elements are arranged on the printed circuit board along a longitudinal axis.

7. The electronic device of claim 6, wherein the first dielectric resonating elements and the second dielectric resonating elements have sidewalls oriented at a non-parallel angle and non-perpendicular angle with respect to the longitudinal axis.

8. The electronic device of claim 1, further comprising openings in the plastic substrate and laterally interposed between the dielectric resonating elements.

9. The electronic device of claim 1, further comprising:
a display having an active area, an inactive area, and a display cover layer overlapping the active area and the inactive area, the inactive area including a notch in the active area; and
peripheral conductive housing structures extending around a periphery of the display, wherein the display is mounted to the peripheral conductive housing structures, the dielectric resonating elements overlap the notch, and the phased antenna array is configured to convey radio-frequency signals through the display cover layer.

10. An electronic device comprising:
a printed circuit board;
a phased antenna array having dielectric columns mounted to a surface of the printed circuit board, wherein
the dielectric columns have first surfaces at the printed circuit board, second surfaces opposite the first surfaces, and sidewalls extending from the first surfaces to the second surfaces,
the dielectric columns are aligned along a longitudinal axis, and
the sidewalls extend non-parallel and non-perpendicular with respect to the longitudinal axis;
feed probes coupled to the dielectric columns and configured to excite a resonant mode of the dielectric columns; and
a dielectric substrate on the printed circuit board and surrounding the dielectric columns, wherein the dielectric substrate has an opening that is interposed between and configured to isolate two adjacent dielectric columns of the dielectric columns.

11. The electronic device of claim 10,
wherein the feed probes comprise metal on the sidewalls of the dielectric columns.

12. The electronic device of claim 11,
wherein the metal is soldered to the printed circuit board.

13. The electronic device of claim 11,
wherein the metal comprises folded sheet metal.

14. The electronic device of claim 13,
wherein the folded sheet metal has a first portion pressed against the sidewalls and a second portion extending from the first portion and along a lateral surface of the printed circuit board.

15. The electronic device of claim 11,
wherein the metal comprises conductive traces.

16. The electronic device of claim 10, further comprising:
a display having an active area, an inactive area, and a display cover layer overlapping the active area and the inactive area, the inactive area including a notch in the active area; and
peripheral conductive housing structures extending around a periphery of the display, wherein the display is mounted to the peripheral conductive housing structures, the dielectric columns overlap the notch, and the phased antenna array is configured to convey radio-frequency signals through the display cover layer.

17. An electronic device comprising:
a printed circuit board;
a phased antenna array having dielectric columns mounted to a surface of the printed circuit board, wherein the dielectric columns have first surfaces at the printed circuit board, second surfaces opposite the first surfaces, and sidewalls extending from the first surfaces to the second surfaces;
antenna feeds coupled to the dielectric columns and configured to excite a resonant mode of the dielectric columns; and
an injection-molded over-mold on the printed circuit board and laterally surrounding the dielectric columns, wherein the second surfaces of the dielectric columns protrude beyond the injection-molded over-mold.

18. The electronic device of claim 17, further comprising:
a display having an active area, an inactive area, and a display cover layer overlapping the active area and the inactive area, the inactive area including a notch in the active area; and
peripheral conductive housing structures extending around a periphery of the display, wherein the display is mounted to the peripheral conductive housing structures, the dielectric columns overlap the notch, and the phased antenna array is configured to convey radio-frequency signals through the display cover layer.

19. The electronic device of claim 17, wherein the dielectric columns comprise first dielectric columns configured to form a first antenna and second dielectric columns configured to form a second antenna.

20. The electronic device of claim 1, wherein the first dielectric resonating elements are configured to convey first radio-frequency signals in a first frequency band and the second dielectric resonating elements are configured to convey second radio-frequency signals in a second frequency band different than the first frequency band.

* * * * *